US012682979B2

(12) United States Patent
Lee et al.

(10) Patent No.: US 12,682,979 B2
(45) Date of Patent: Jul. 14, 2026

(54) MEMORY DEVICE FOR SUPPORTING TRIPLE ADJACENT ERROR DETECTION, MEMORY SYSTEM HAVING THE SAME, AND OPERATING METHOD THEREOF

(71) Applicant: Samsung Electronics Co., Ltd., Suwon-si (KR)

(72) Inventors: Kijun Lee, Suwon-si (KR); Sang-Hyo Kim, Suwon-si (KR); Heeju Na, Suwon-si (KR); Myungkyu Lee, Suwon-si (KR); Sunghye Cho, Suwon-si (KR); Donghyun Kong, Suwon-si (KR); Kyomin Sohn, Suwon-si (KR)

(73) Assignees: SAMSUNG ELECTRONICS CO., LTD., Gyeonggi-do (KR); RESEARCH & BUSINESS FOUNDATION SUNGKYUNKWAN UNIVERSITY, Gyeonggi do (KR)

( * ) Notice: Subject to any disclaimer, the term of this patent is extended or adjusted under 35 U.S.C. 154(b) by 58 days.

(21) Appl. No.: 18/648,882

(22) Filed: Apr. 29, 2024

(65) Prior Publication Data

US 2025/0149105 A1 May 8, 2025

(30) Foreign Application Priority Data

Nov. 3, 2023 (KR) ........................ 10-2023-0151085

(51) Int. Cl.
*G11C 29/42* (2006.01)
(52) U.S. Cl.
CPC .................................... *G11C 29/42* (2013.01)
(58) Field of Classification Search
CPC ..... G11C 29/42; G11C 29/52; G06F 11/1032; G06F 11/1048
See application file for complete search history.

(56) References Cited

U.S. PATENT DOCUMENTS 6,968,491 B1 * 11/2005 Yang ..................... H03M 13/05
714/752
7,243,293 B2 7/2007 Chen
(Continued)

FOREIGN PATENT DOCUMENTS

| EP | 0107038 A2 * | 5/1984 | .......... G06F 11/1028 |
| KR | 10-1304570 B1 | 8/2013 | |
| KR | 10-2423489 B1 | 5/2022 | |

OTHER PUBLICATIONS

R. S. Katti, T. A. Gulliver and V. K. Bhargava, "Comments on "A systematic (16, 8) code for correcting double errors and detecting triple-adjacent errors" [with reply]," in IEEE Transactions on Computers, vol. 44, No. 12, pp. 1472-1474, Dec. 1995.*

(Continued)

*Primary Examiner* — Steve N Nguyen
(74) *Attorney, Agent, or Firm* — Harness, Dickey & Pierce, P.L.C.

(57) ABSTRACT

A memory device according to various example embodiments includes a memory cell array having a plurality of memory cells connected to word lines and bit lines; and an error correction circuit configured to perform error correction on data read from the memory cell array, wherein the error correction circuit is configured to perform at least one of a 1-bit error correction operation, a 2-bit error detection operation, or a 3-bit error detection operation using a parity check matrix, and the parity check matrix is configured so that columns are arranged in an order of odd-odd-even degree, and leading one (LO) of each row is arranged in a stepped structure.

19 Claims, 42 Drawing Sheets

10

(56) References Cited

U.S. PATENT DOCUMENTS

| | | | | |
|---|---|---|---|---|
| 8,560,927 | B1 * | 10/2013 | Pagiamtzis | ............. G06F 11/10 |
| | | | | 714/766 |
| 9,336,078 | B1 | 5/2016 | Pagiamtzis et al. | |
| 11,281,526 | B2 | 3/2022 | Artieri et al. | |
| 2004/0148560 | A1 * | 7/2004 | Hocevar | .............. H03M 13/118 |
| | | | | 714/801 |
| 2011/0072331 | A1 * | 3/2011 | Sakaue | ............... G06F 11/1012 |
| | | | | 714/763 |
| 2013/0262957 | A1 | 10/2013 | Wu et al. | |
| 2017/0371746 | A1 * | 12/2017 | Kim | ....................... G06F 3/0679 |
| 2022/0158656 | A1 * | 5/2022 | Pae | .................... H03M 13/1108 |
| 2025/0173217 | A1 * | 5/2025 | Jang | .................... G06F 11/1004 |

OTHER PUBLICATIONS

A. Sanchez-Macian, P. Reviriego and J. A. Maestro, "Enhanced Detection of Double and Triple Adjacent Errors in Hamming Codes Through Selective Bit Placement," in IEEE Transactions on Device and Materials Reliability, vol. 12, No. 2, pp. 357-362, Jun. 2012.*

A. Neale, M. Jonkman and M. Sachdev, "Adjacent-MBU-Tolerant SEC-DED-TAEC-yAED Codes for Embedded SRAMs," in IEEE Transactions on Circuits and Systems II: Express Briefs, vol. 62, No. 4, pp. 387-391, Apr. 2015.*

A. Sánchez-Macián, P. Reviriego and J. A. Maestro, "Hamming SEC-DAED and Extended Hamming SEC-DED-TAED Codes Through Selective Shortening and Bit Placement," in IEEE Transactions on Device and Materials Reliability, vol. 14, No. 1, pp. 574-576, Mar. 2014.*

M. Y. Hsiao, "A Class of Optimal Minimum Odd-weight-column SEC-DED Codes," in IBM Journal of Research and Development, vol. 14, No. 4, pp. 395-401, Jul. 1970.*

P. Reviriego, J. Martínez, S. Pontarelli and J. A. Maestro, "A Method to Design SEC-DED-DAEC Codes With Optimized Decoding," in IEEE Transactions on Device and Materials Reliability, vol. 14, No. 3, pp. 884-889, Sep. 2014.

Alfonso Sánchez-Macián, et al. "Hamming SEC-DAED and Extended Hamming SEC-DED-TAED Codes Through Selective Shortening and Bit Placement", IEEE Transactions On Device and Materials Reliability, vol. 14, No. 1, pp. 574-576 (2014).

R. W. Hamming, "Error Detecting and Error Correcting Codes" Bell Sys. Tech. Journal, vol. 29, No. 2, pp. 147-160, (1950).

M. Y. Hsiao, "A Class of Optimal Minimum Odd-weight-column SEC-DED codes" IBM J. Res. Develop, vol. 14, No. 4, pp. 301-395, (1970).

A. Dutta and N. A. Touba, "Multiple Bit Upset Tolerant Memory Using a Selective Cycle Avoidance Based SEC-DED-DAEC Code" 25th IEEE VLSI Test Symposium (VTS'07), pp. 349-354, (2007).

* cited by examiner

FIG. 5

$S_{DAEC} =$

SEC-DED-TAED (22, 16) $H =$

---

Figure 11:
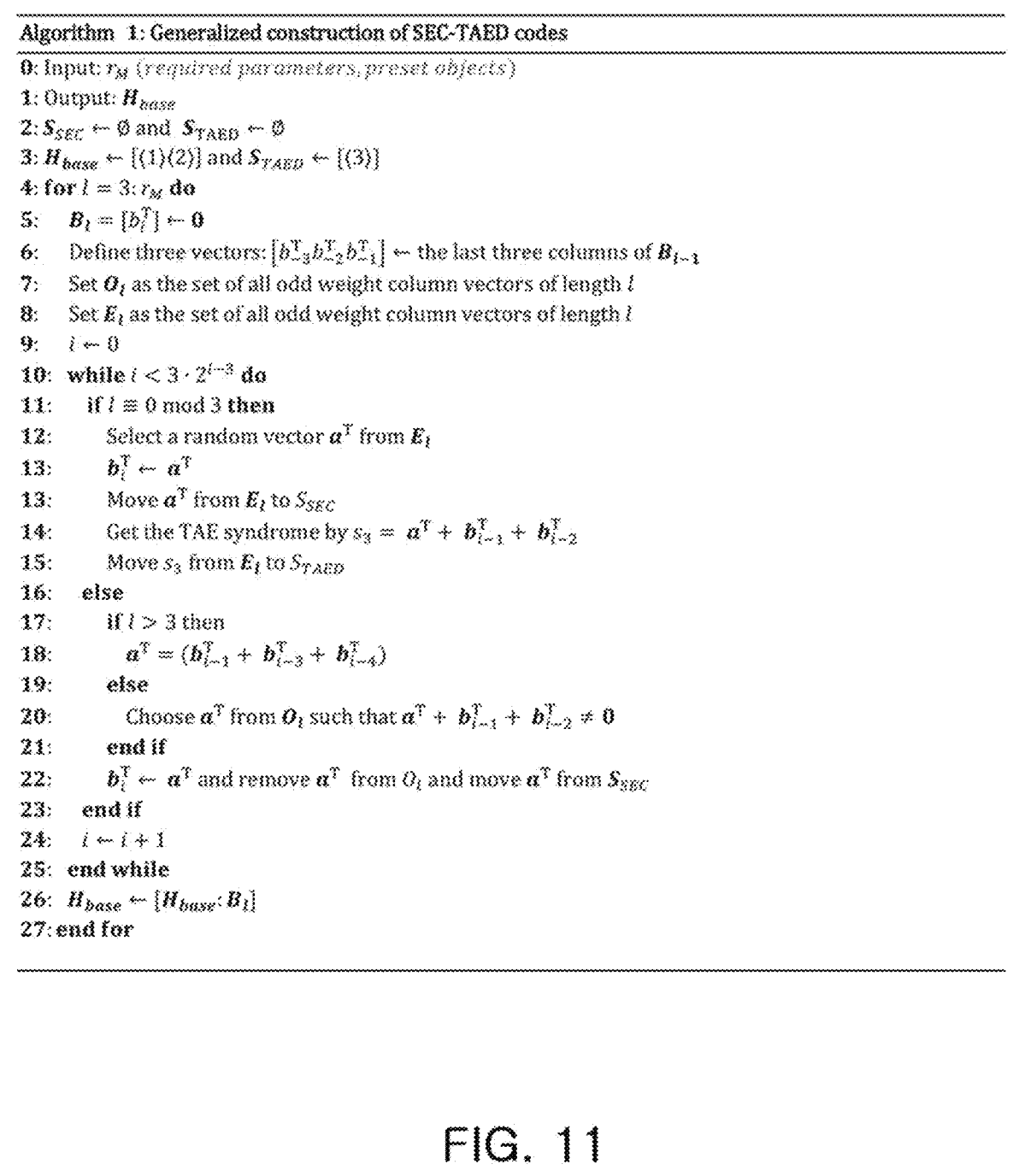

Algorithm 1: Generalized construction of SEC-TAED codes

---

0: Input: $r_M$ (*required parameters, preset objects*)

1: Output: $H_{base}$

2: $S_{SEC} \leftarrow \emptyset$ and $S_{TAED} \leftarrow \emptyset$

3: $H_{base} \leftarrow [(1)(2)]$ and $S_{TAED} \leftarrow [(3)]$

4: for $l = 3 : r_M$ do

5:    $B_l = [b_i^T] \leftarrow 0$

6:    Define three vectors: $[b_{-3}^T b_{-2}^T b_{-1}^T] \leftarrow$ the last three columns of $B_{l-1}$ 7:    Set $O_l$ as the set of all odd weight column vectors of length $l$ 8:    Set $E_l$ as the set of all odd weight column vectors of length $l$ 9:    $i \leftarrow 0$ 10:    while $i < 3 \cdot 2^{l-3}$ do

11:      if $l \equiv 0 \bmod 3$ then

12:        Select a random vector $a^T$ from $E_l$

13:        $b_i^T \leftarrow a^T$

13:        Move $a^T$ from $E_l$ to $S_{SEC}$

14:        Get the TAE syndrome by $s_3 = a^T + b_{i-1}^T + b_{i-2}^T$

15:        Move $s_3$ from $E_l$ to $S_{TAED}$

16:      else

17:        if $l > 3$ then

18:          $a^T = (b_{i-1}^T + b_{i-3}^T + b_{i-4}^T)$

19:        else

20:          Choose $a^T$ from $O_l$ such that $a^T + b_{i-1}^T + b_{i-2}^T \neq 0$ 21:        end if

22:        $b_i^T \leftarrow a^T$ and remove $a^T$ from $O_l$ and move $a^T$ from $S_{SEC}$ 23:      end if

24:      $i \leftarrow i + 1$

25:    end while

26:    $H_{base} \leftarrow [H_{base} : B_l]$

27: end for

SEC-TAED (38, 32) *H*

FIG. 27

SEC-DED-TAED
(39, 32) $\mathbf{H} =$

FIG. 29 systematic SEC-DED-TAED (39, 32) $H =$

| Even | Odd | Odd | Even | Odd | Odd | Even | Odd | Odd | Even | Odd | Odd | Even | Odd | Odd | Even | Odd |
|---|---|---|---|---|---|---|---|---|---|---|---|---|---|---|---|---|
| a | b | c | d | e | f | g | h | i | j | k | l | m | n | o | p | q |

$a + b + c = A$
$b + c + d = B$
$c + d + e = c + d + (a + b + d) = a + b + c + d = A$
$d + e + f = d + e + b + c + e = b + c + d = B$
$e + f + g = C$
$f + g + h = f + g + d + e + g = d + e + f = B$
$g + h + i = g + h + e + f + h = g + h + e = C$
$h + i + j = D$
$i + j + k = i + j + g + h + j = g + h + i = C$
$j + k + l = j + k + h + i + k = i + j + h = D$
$k + l + m = E$
$l + m + n = l + m + j + k + m = j + k + l = D$
$m + n + o = m + n + k + l + n = k + l + m = E$
$n + o + p = F$
$o + p + q = o + p + m + n + p = m + n + o = E$ $$\text{odd} \quad \text{odd} \quad \text{even} \quad \text{odd} \quad \text{odd} \quad \text{even} \quad \text{odd} \quad \text{odd}$$
$$\boxed{h_{i-4} \quad h_{i-3} \quad \boxed{h_{i-2} \quad h_{i-1} \quad \boxed{h_i}} \quad h_{i+1} \quad \boxed{h_{i+1}} \quad h_{i+2}}$$

$$h_i = h_{i-1} + h_{i-3} + h_{i-4}$$
$$① \quad h_{i-4} + h_{i-3} + h_{i-2} = (h_{i-1} + h_i) + h_{i-2}$$
$$= h_{i-2} + h_{i-1} + h_i$$
$$② \quad h_i + h_{i+1} + h_{i+2} = h_i + h_{i+1} + (h_{i+1} + h_{i-1} + h_{i-2})$$
$$= h_{i-2} + h_{i-1} + h_i$$
$$\Uparrow \quad h_{i-4} + h_{i-3} + h_{i-2} = h_{i-2} + h_{i-1} + h_i = h_i + h_{i+1} + h_{i+2}$$

FIG. 41

MEMORY DEVICE FOR SUPPORTING TRIPLE ADJACENT ERROR DETECTION, MEMORY SYSTEM HAVING THE SAME, AND OPERATING METHOD THEREOF

CROSS-REFERENCE TO RELATED APPLICATION(S)

This application claims benefit of priority to Korean Patent Application No. 10-2023-0151085 filed on Nov. 3, 2023, in the Korean Intellectual Property Office, the disclosure of which is incorporated herein by reference in its entirety.

BACKGROUND

Various example embodiments relate to a memory device for supporting triple adjacent error detection, a memory system having the same, and/or an operating method thereof.

Generally, memory systems can experience errors due to various external factors, and these errors can significantly impact system performance. To mitigate or reduce the impact of this, various error correction technologies are being developed. SEC (Single Error Correction) automatically corrects single-bit errors to ensure data integrity. This effectively handles minor errors within the memory, contributing to system stability. DED (Double Error Detection) can detect two simultaneous errors but cannot correct them. This technology alerts the system to abnormalities, allowing for appropriate measures to prevent them from escalating into more significant issues. TAED (Triple Adjacent Error Detection) detects errors occurring in three adjacent bits. This method enables the early detection of problems that may result from physical damage to memory chips or related errors. These technologies, each based on its characteristics, enhance the reliability of memory systems and protect against potential data loss or corruption.

SUMMARY

Various example embodiments may provide a memory device having a novel error correction technology, a memory system having the same, and/or an operating method thereof.

Alternatively or additionally, various example embodiments may provide a memory device supporting Triple Adjacent Error Detection (TAED), a memory system having the same, and an operating method thereof.

According to some example embodiments, provided is a memory device including: a memory cell array having a plurality of memory cells connected to word lines and bit lines; and an error correction circuit configured to perform error correction on data read from the memory cell array. The error correction circuit is configured to perform at least one of a 1-bit error correction operation, a 2-bit error detection operation, or a 3-bit error detection operation using a parity check matrix, and the parity check matrix is configured so that columns are arranged in an order of odd-odd-even degree, and a leading one (LO) of each row is arranged in a stepped structure.

Alternatively or additionally according to various example embodiments, provided is a memory system including: at least one memory device configured to perform a first error correction operation; and a controller configured to control the at least one memory device and to perform a second error correction operation. At least one of the first and second error correction operations includes performing a 1-bit error correction operation, a 2-bit error detection operation, and a 3-bit error detection operation using a parity check matrix, and the parity check matrix is configured so that columns are arranged in an order of odd-odd-even degree, and a leading one (LO) of each row is arranged in a stepped structure.

Alternatively or additionally, provided is an operating method of a memory device, including: encoding a message using a parity check matrix; receiving a codeword generated by encoding the message through a channel; and decoding the received codeword using the parity check matrix, wherein the parity check matrix is configured so that columns are arranged in an order of odd-odd-even degree, and a leading one (LO) of each row is arranged in a stepped structure.

A memory device having a novel error correction technology, a memory system having the same, and/or an operating method thereof according to various example embodiments may map at least three types of errors into one syndrome.

A memory device having a novel error correction technology, a memory system having the same, and/or an operating method thereof according to various example embodiments may enable DED by inserting an additional row into an H-matrix in an ECC circuit supporting SEC/TAED.

BRIEF DESCRIPTION OF DRAWINGS

The above and other aspects, features, and advantages of example embodiments will be more clearly understood from the following detailed description, taken in conjunction with the accompanying drawings, in which:

FIG. 5 is an example view illustrating a PCM of Dutta and Touba SEC-DED-DAEC codes;

FIG. 11 is an example view illustrating an algorithm for generating SEC-TAED codes depending on an input parity length according to some example embodiments;

Figure 13:
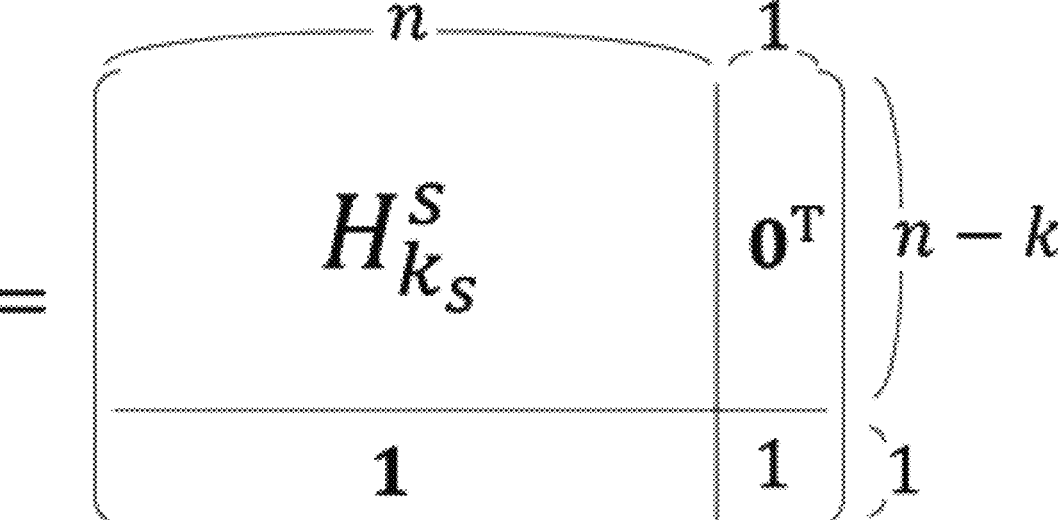
Figure 14:
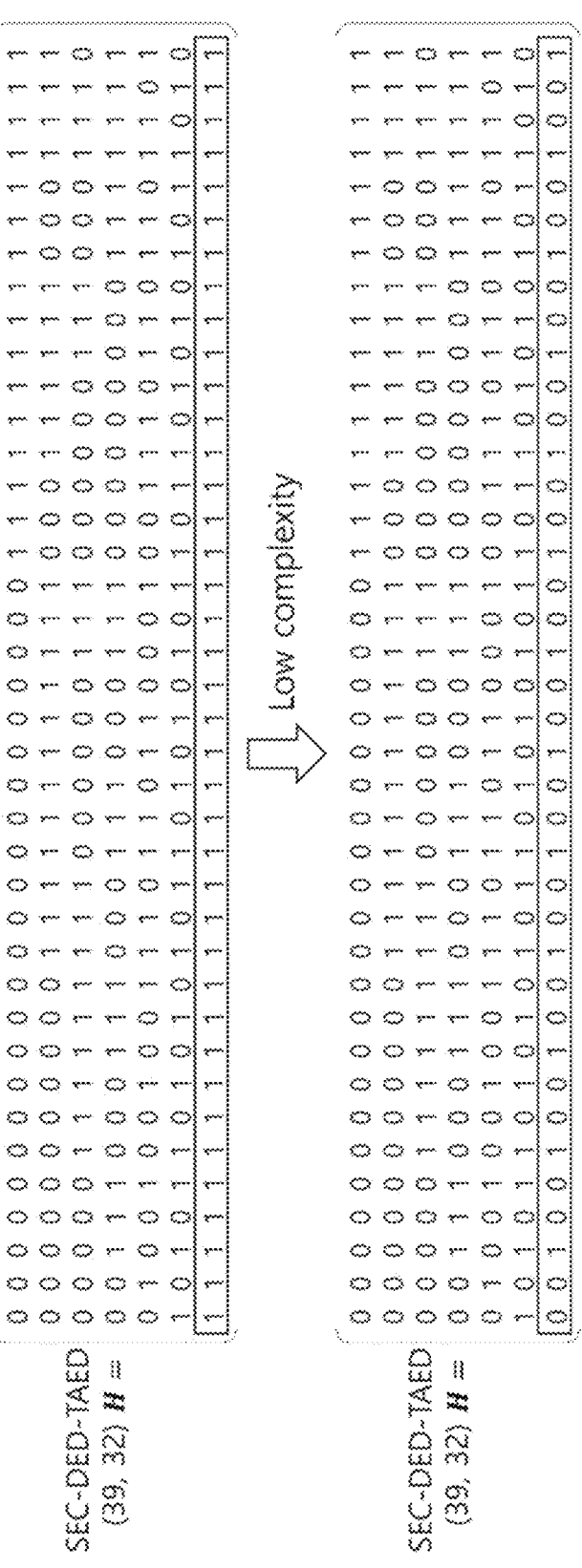
Figure 15:
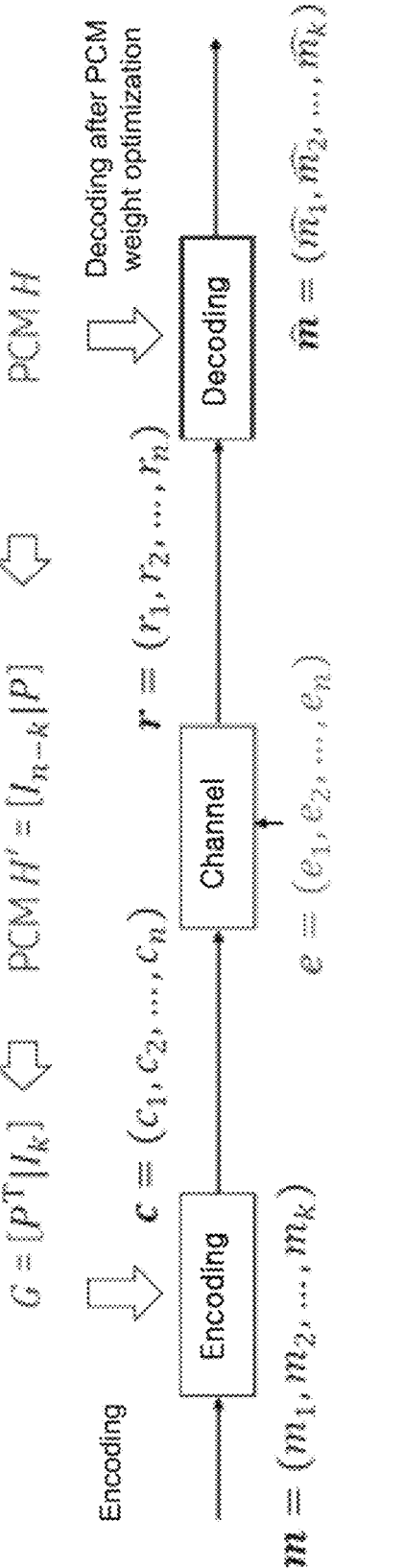
Figure 16:
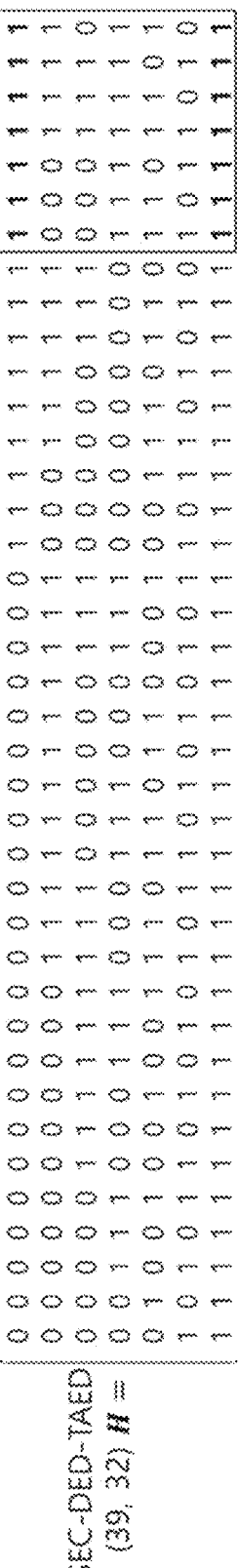
Figure 17:
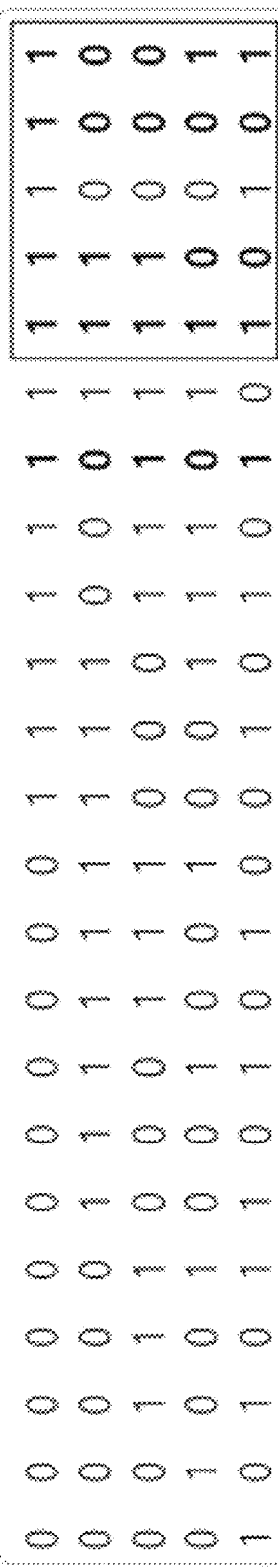
Figure 18:
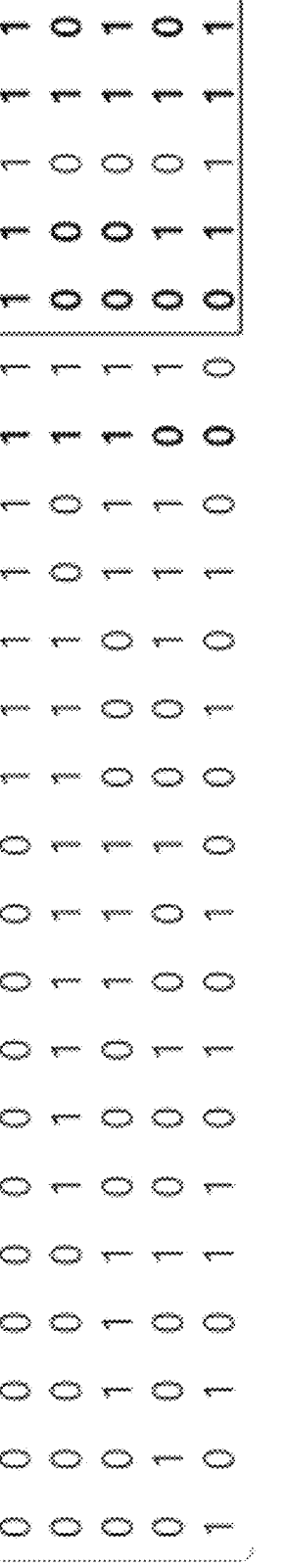
Figure 19:
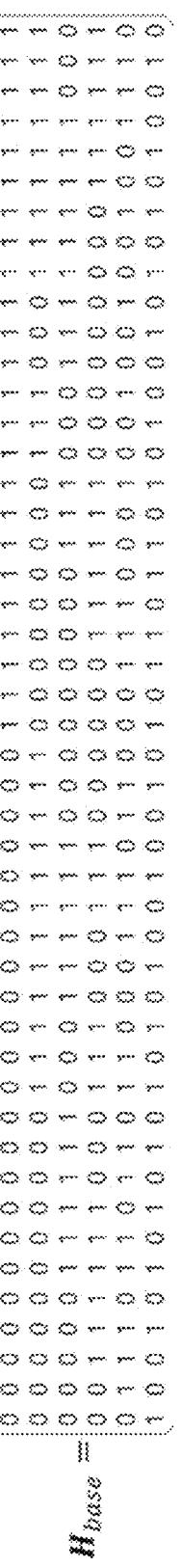
Figure 21:
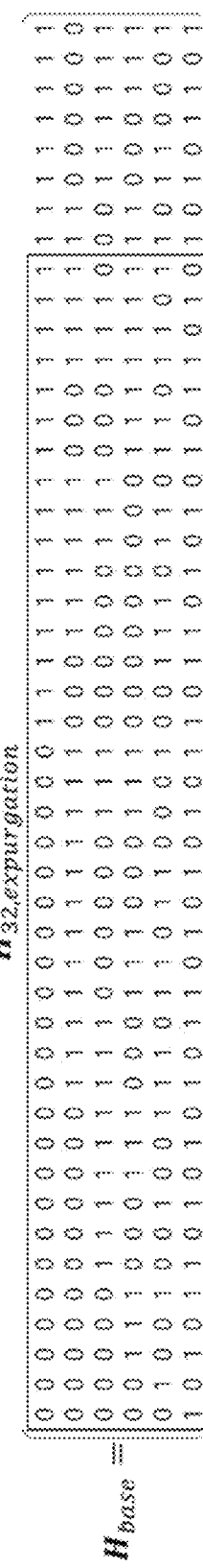
Figure 22:
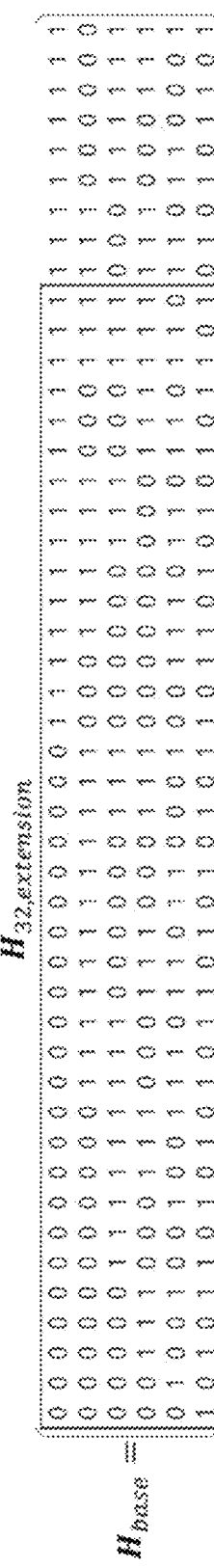
Figure 23:
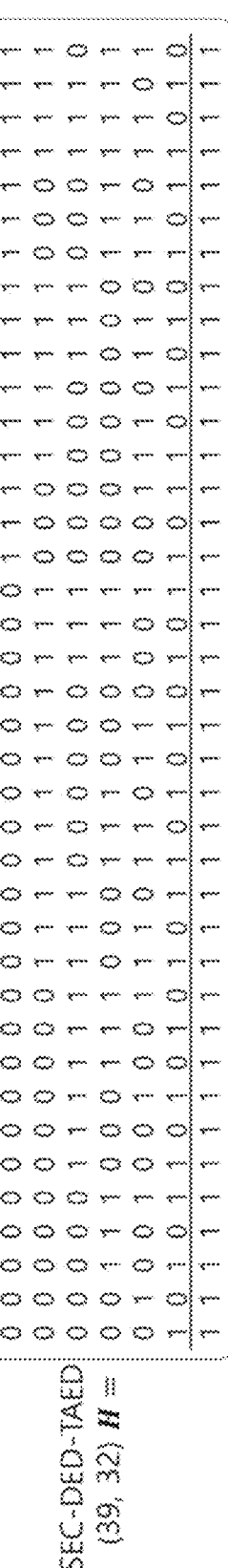
Figure 24:
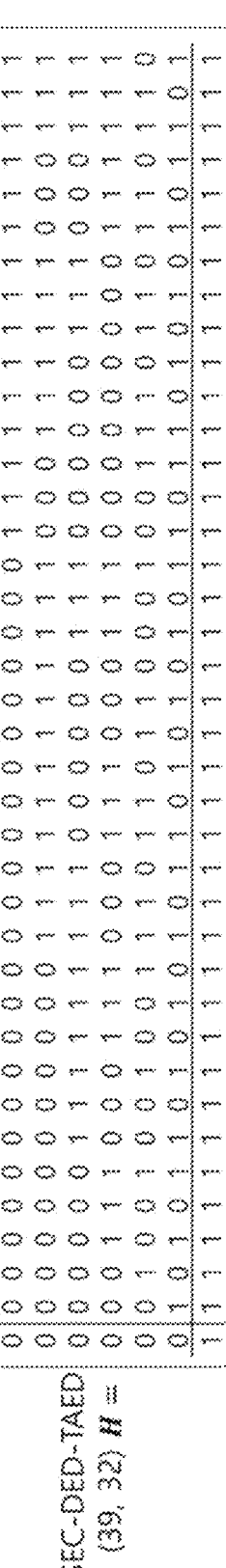
Figure 25:
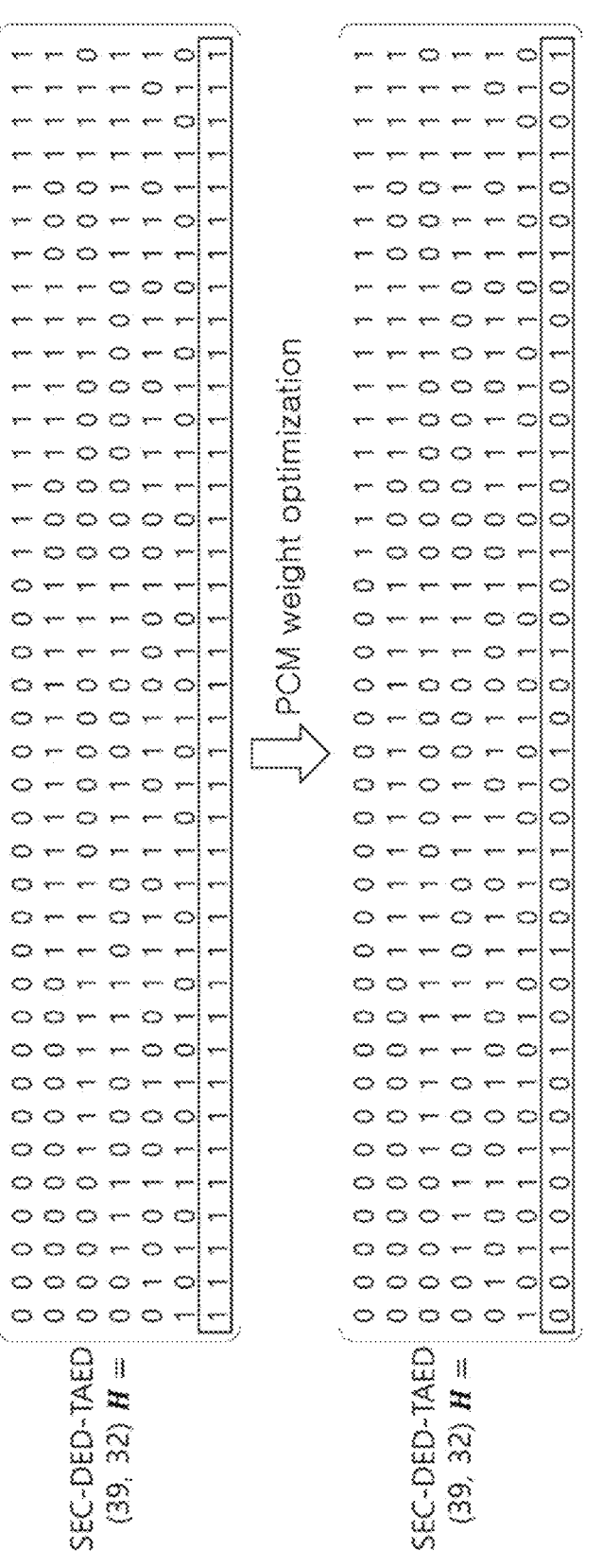
Figure 26:
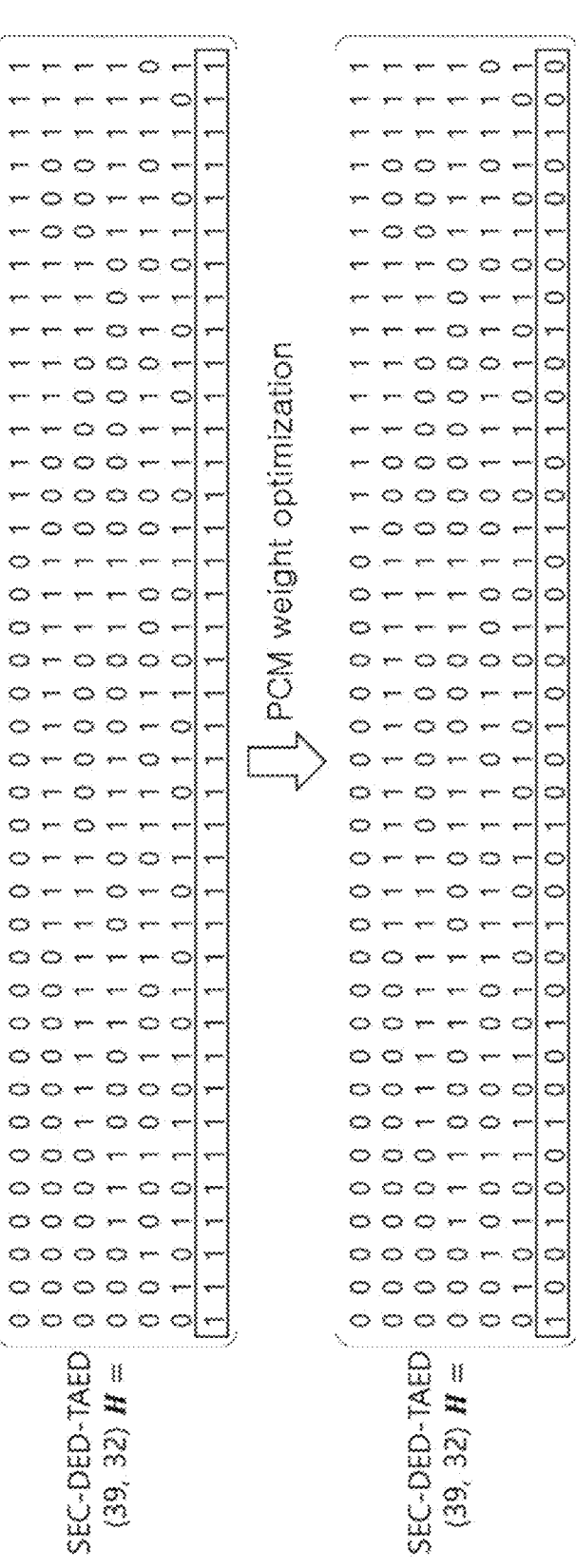
Figure 28:
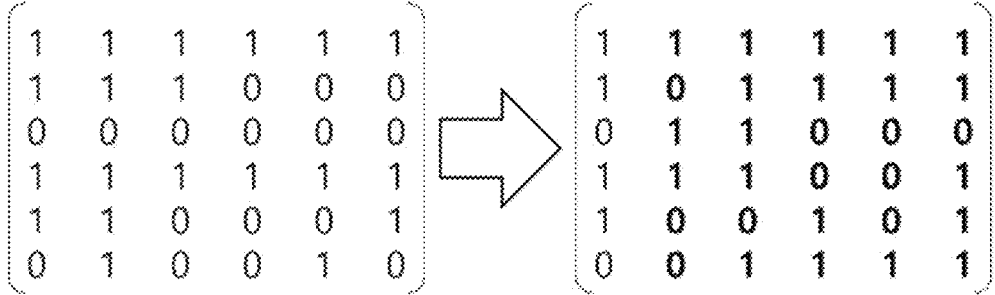
Figure 34:
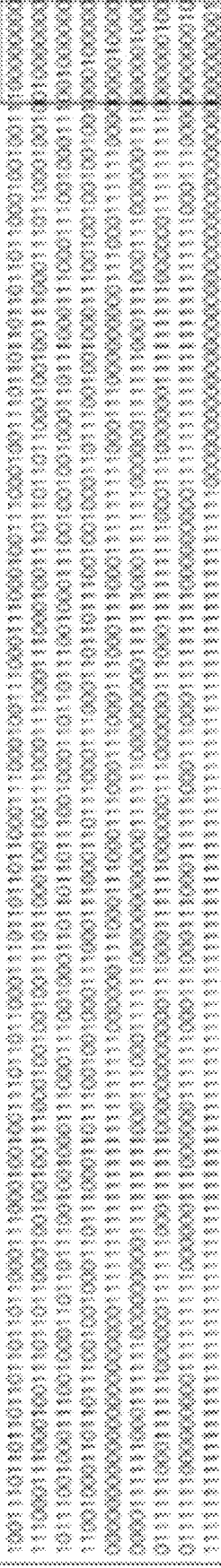
Figure 35:
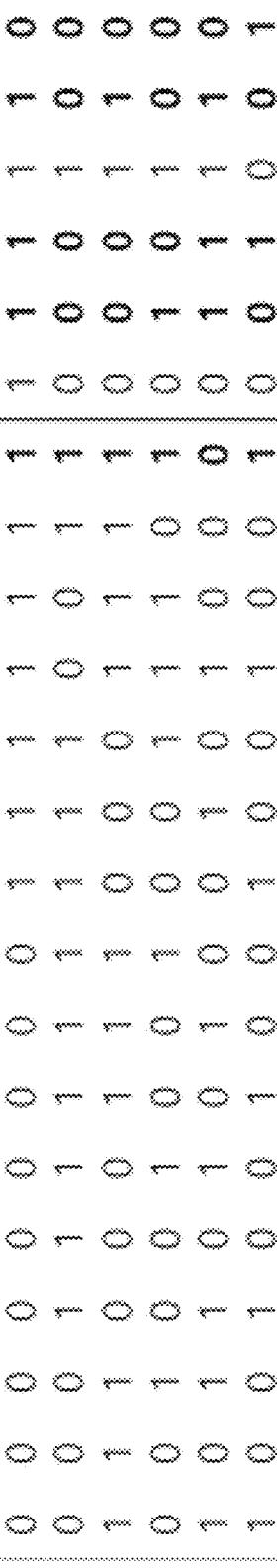
Figure 36:
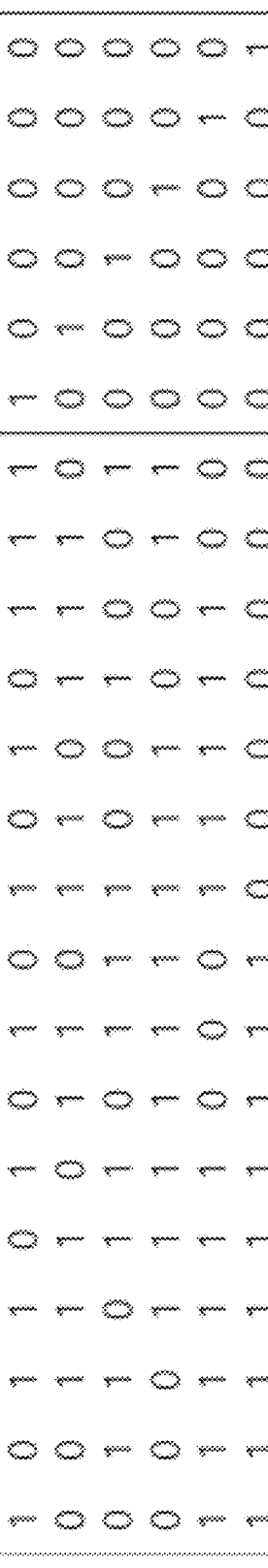
Figure 37:
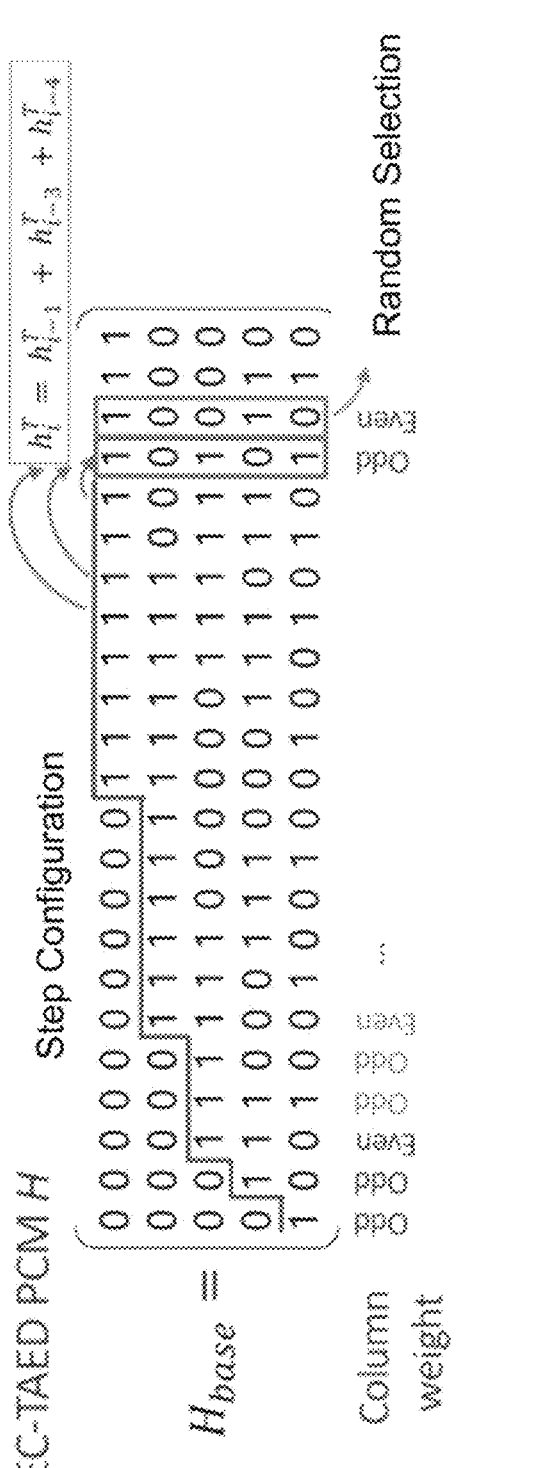
Figure 38:
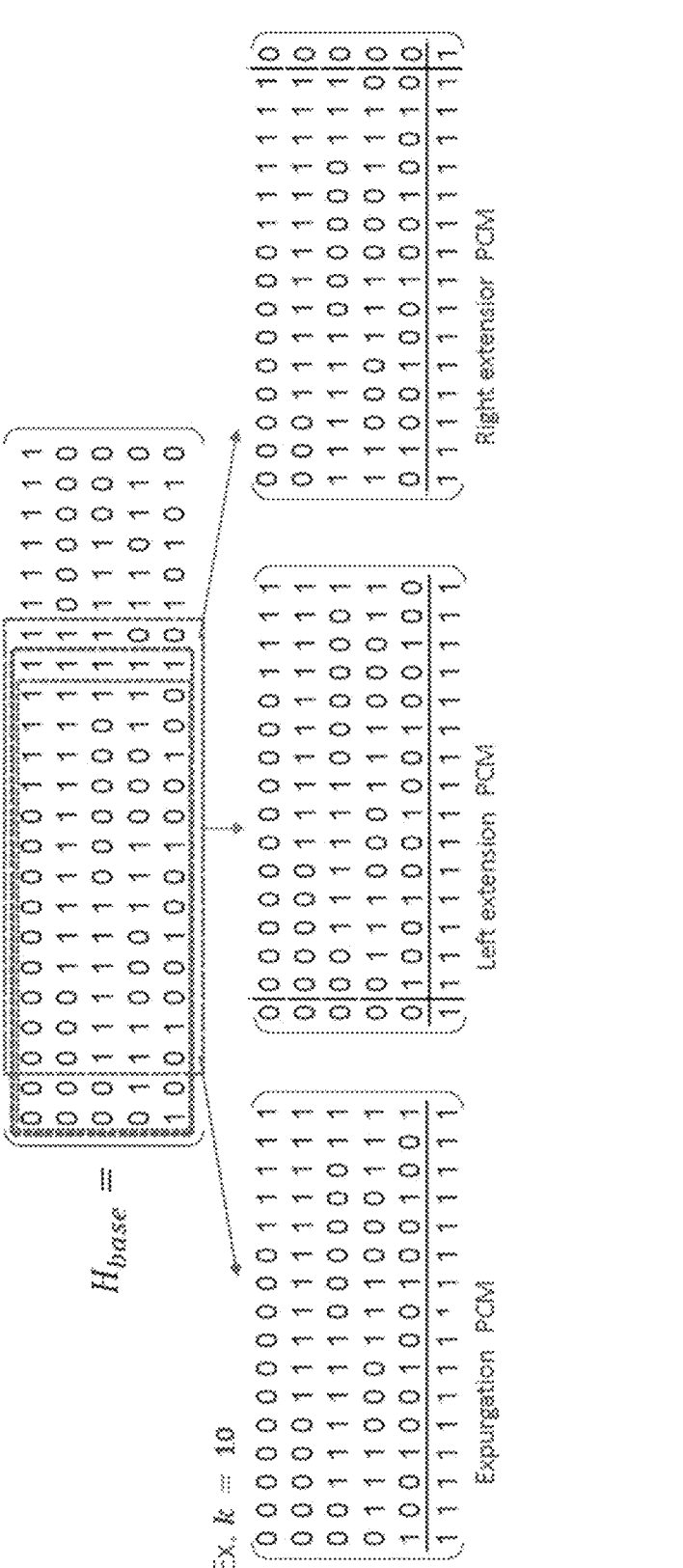
Figure 39:
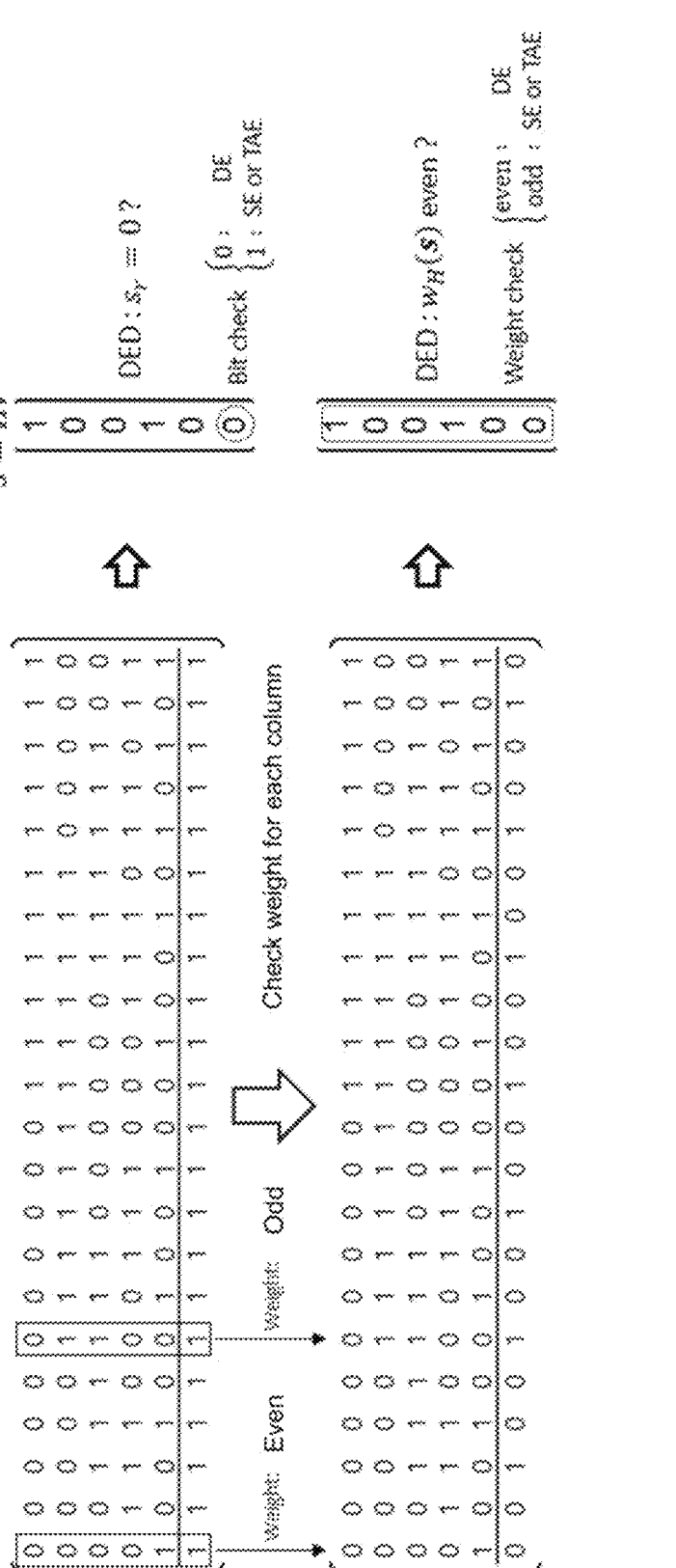
Figure 40:
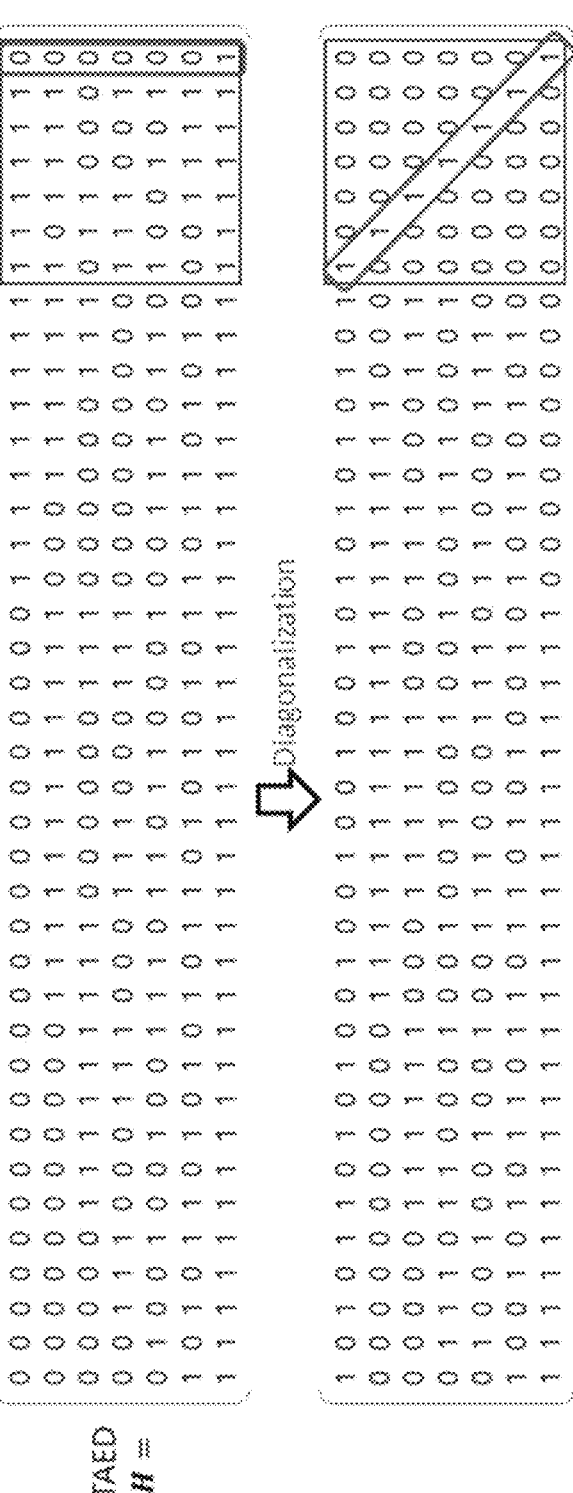
Figure 42:
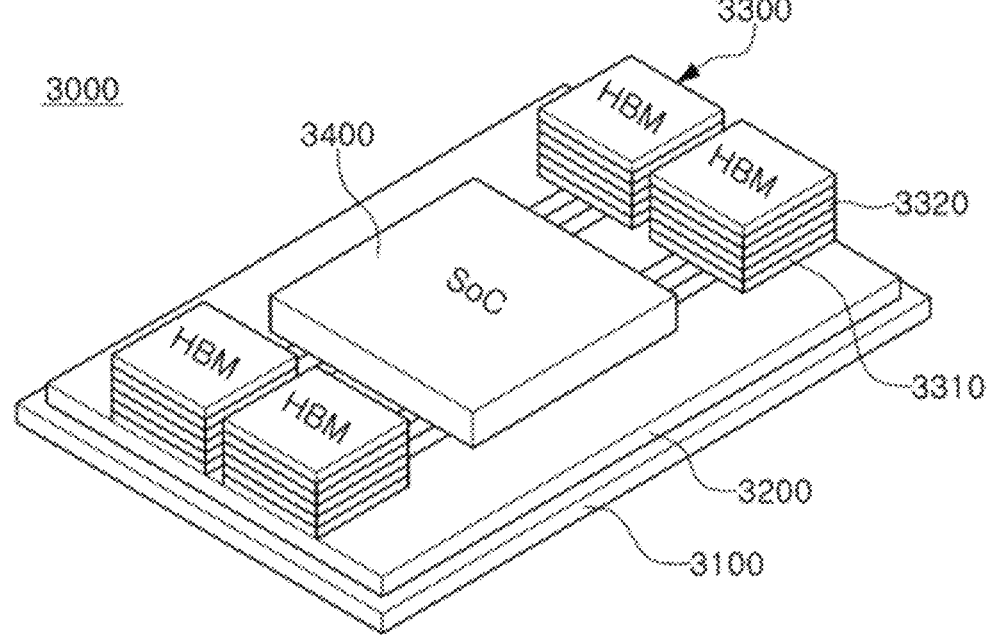

of a SEC-DED-TAED code through expurgation by PCM $$H_{k_s}^s$$

from a PCM perspective;

FIG. 13 is an example view illustrating PCM $$H_k^e$$

when PCM H performs expurgation;

FIG. 14 is an example view illustrating a PCM low change for low latency low complexity of a SEC-DED-TAED code which is subject to expurgation;

FIG. 15 is an example view illustrating a schematic diagram of the use of a systematic SEC-DED-TAED code;

FIG. 16 is an example view illustrating a SEC-DED-TAED code PCM in which an $H_{sub}$ includes two all-1 rows;

FIG. 17 is an example view illustrating $$H_{k_s}^s$$

when a message length generated through an SEC-TAED design method is 16;

FIG. 18 is an example view illustrating a PCM of SEC-TAED codes in which $$H_{sub}^{SEC\text{-}TAED}$$

is a full rank when a message length is 16;

FIG. 19 is a view illustrating an example embodiment of $H_{base}$ obtained through an SEC-TAED code design for a parity length of 6;

Figure 20:
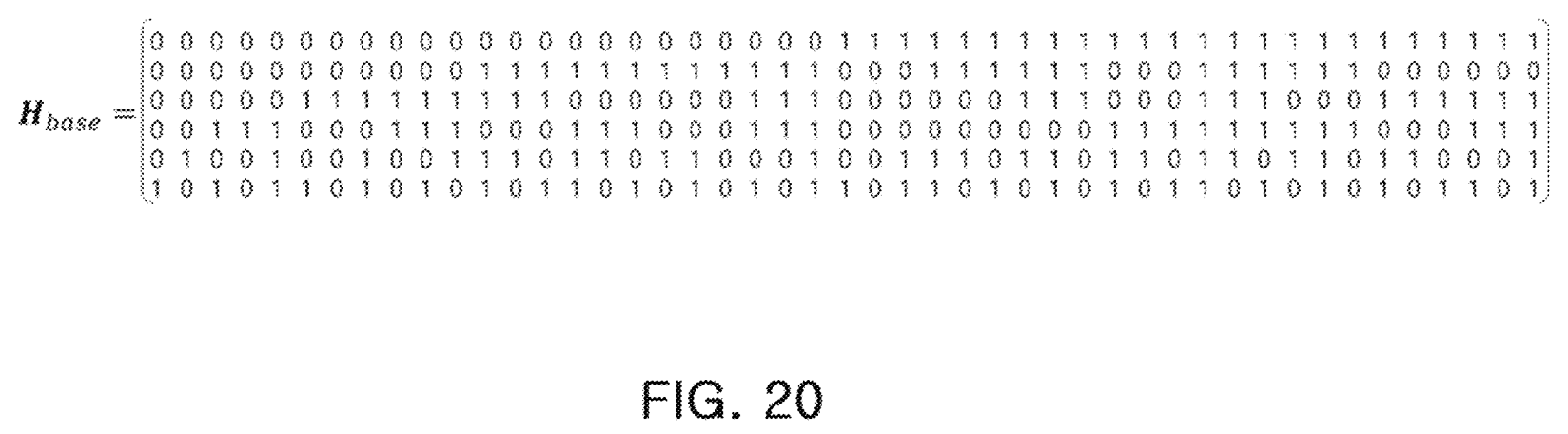

FIG. 20 is a view illustrating another example embodiment of $H_{base}$ obtained through an SEC-TAED code design for a parity length of 6;

FIG. 21 is an example view illustrating an SEC-TAED submatrix for a message length of 32 in consideration of expurgation;

FIG. 22 is an example view illustrating an SEC-TAED submatrix for a message length of 32 in consideration of a left extension;

FIG. 23 is an example view illustrating a (39, 32) SEC-DED-TAED code through expurgation;

FIG. 24 is an example view illustrating a (39, 32) SEC-DED-TAED code through a left extension;

FIG. 25 is an example view illustrating optimization in a PCM of a (39, 32) SEC-DED-TAED code through expurgation;

FIG. 26 is an example view illustrating optimization in a PCM of a (39, 32) SEC-DED-TAED code through an extension;

Figure 27:
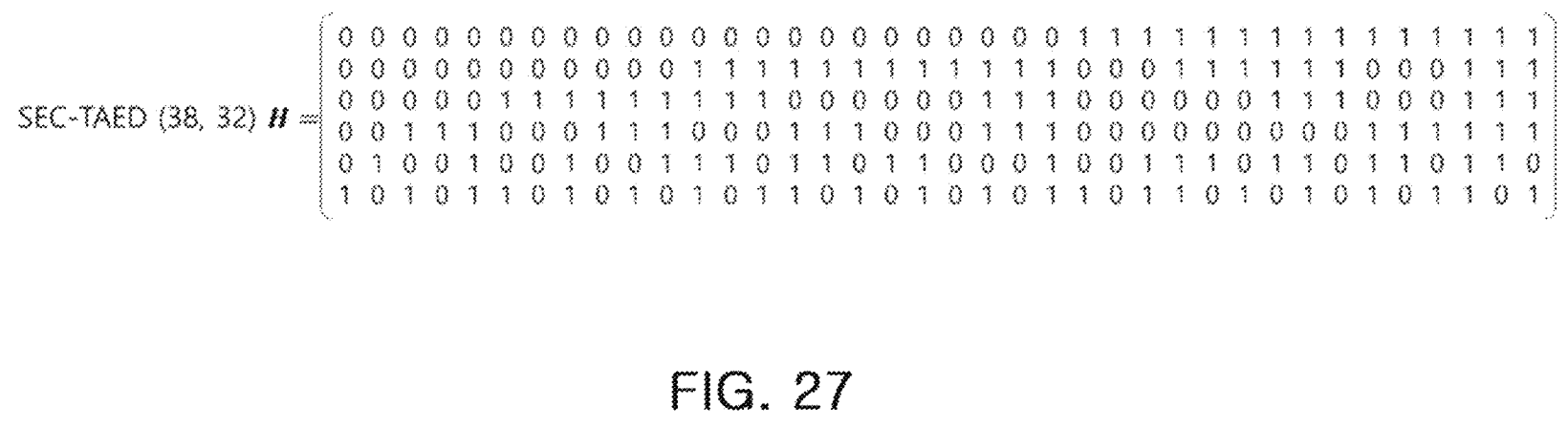

FIG. 27 is an example view illustrating a PCM of SEC-TAED codes having a distributed parity;

FIG. 28 is an example view illustrating submatrix column vector reselection for a full rank (6);

Figure 29:
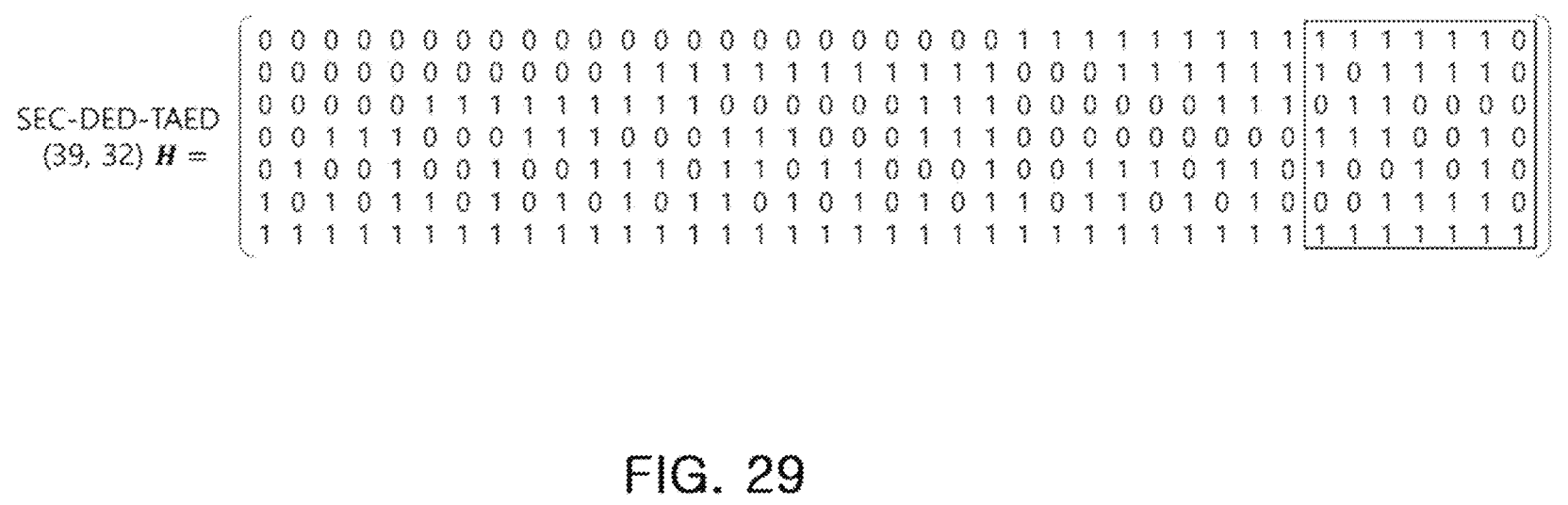

FIG. 29 is an example view illustrating a PCM of a (39, 32) SEC-DED-TAED code having a localized parity;

Figure 30:
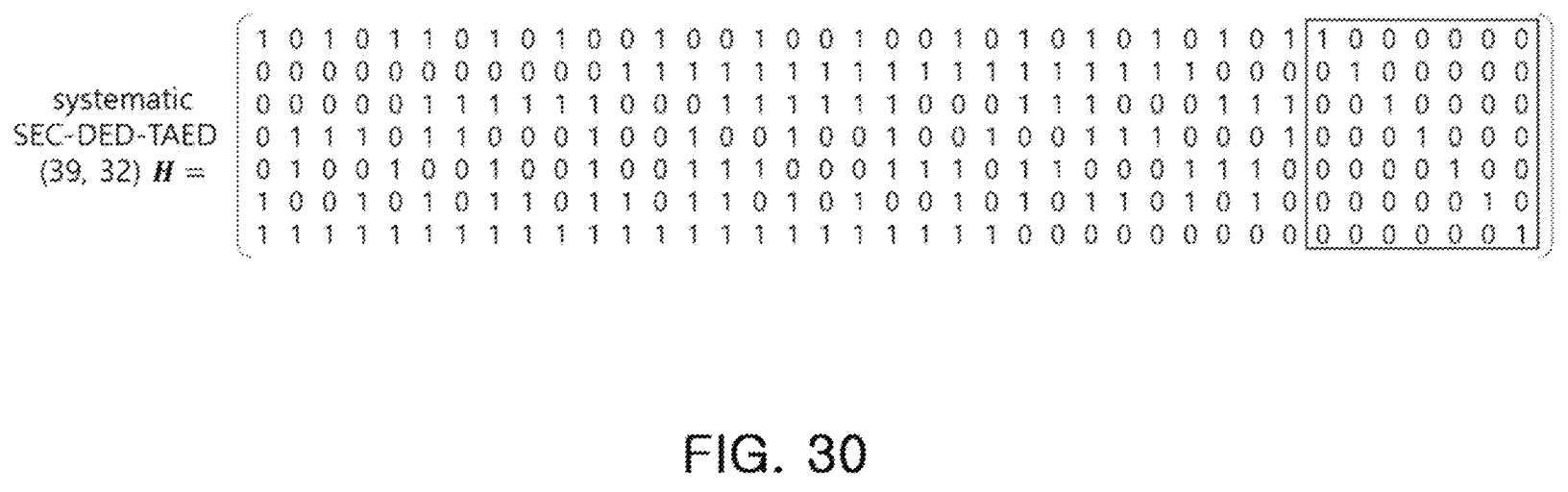

FIG. 30 is an example view illustrating a PCM of a diagonalized (39, 32) SEC-DED-TAED code;

Figure 31:
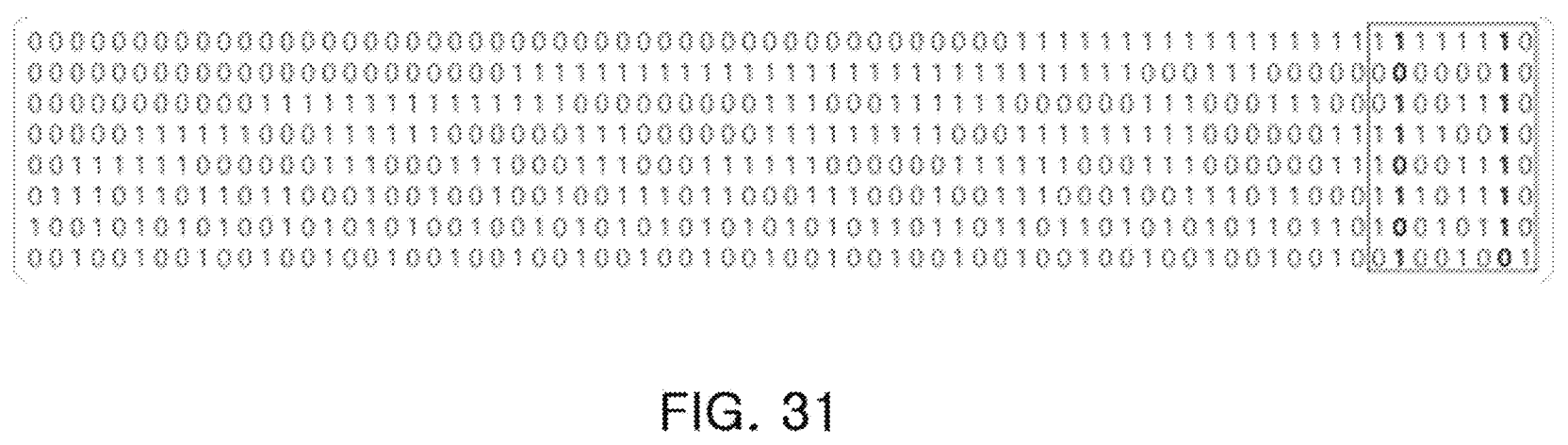

FIG. 31 is an example view illustrating a PCM of a (72, 64) SEC-DED-TAED code having a localized parity;

Figure 32:
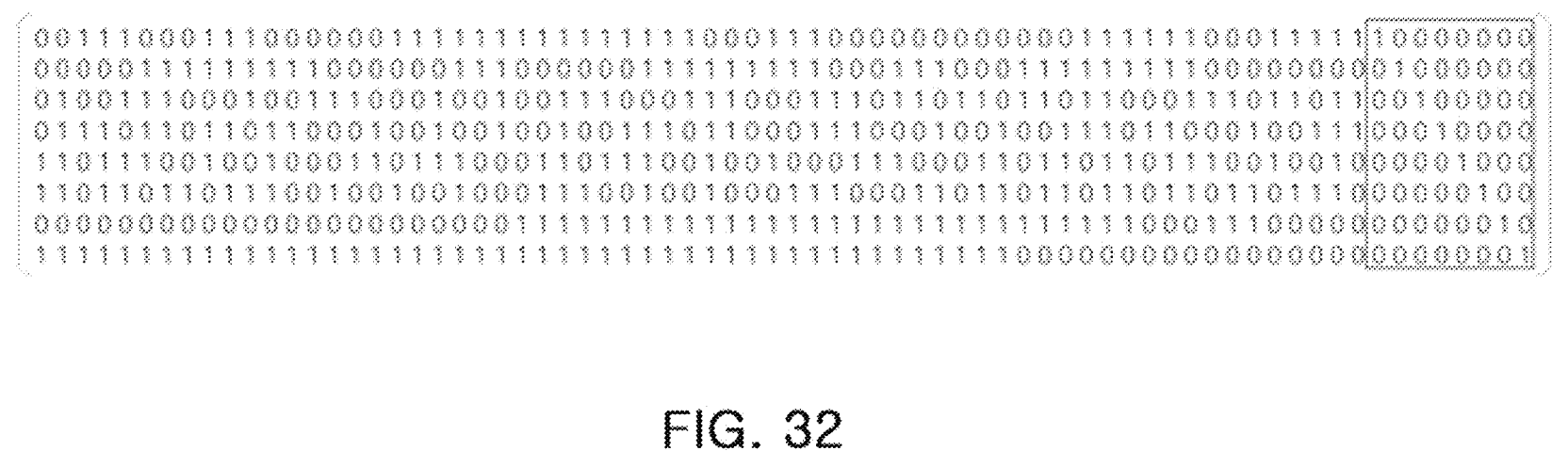

FIG. 32 is an example view illustrating a PCM of a diagonalized (72, 64) SEC-DED-TAED code;

Figure 33:
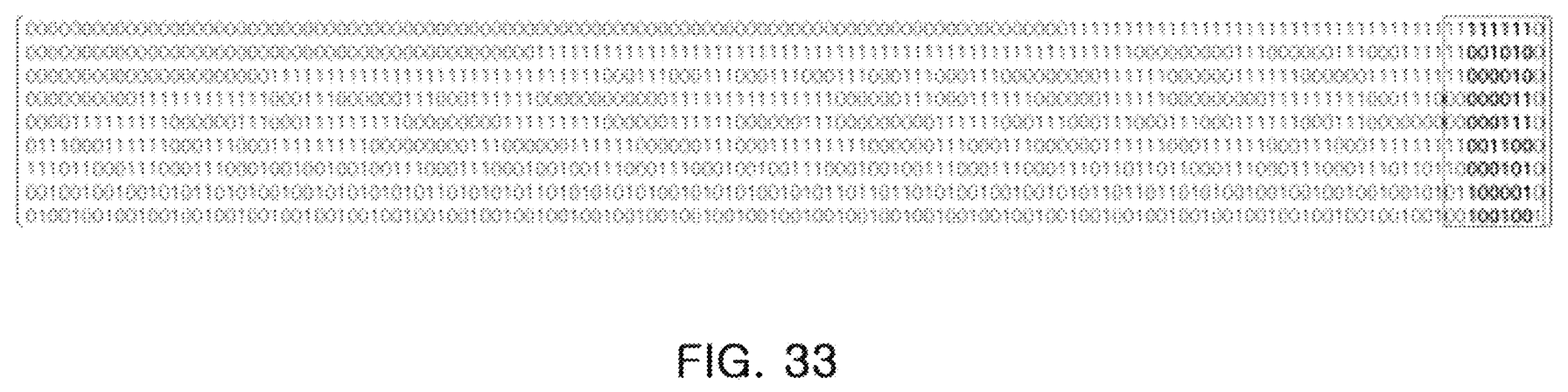

FIG. 33 is an example view illustrating PCM of a (137, 128) SEC-DED-TAED code having a localized parity;

FIG. 34 is an example view illustrating a PCM rule of a diagonalized (137,128) SEC-DED-TAED code;

FIG. 35 is an example view illustrating PCM of (22, 16) SEC-DED-TAED code having localized parity;

FIG. 36 is an example view illustrating PCM of a diagonalized (22, 16) SEC-DED-TAED code;

FIG. 37 is a view illustrating a SEC-DED-TAED code generation method according to some example embodiments;

FIG. 38 is an example view illustrating a process of imparting DED characteristics according to some example embodiments;

FIG. 39 is a view illustrating PCM weight optimization for low latency low complexity decoding according to some example embodiments;

FIG. 40 is a view illustrating a SEC-DED-TAED code design technique in consideration of a systematic code to reduce code complexity according to some example embodiments;

FIG. 41 is a view illustrating a TAE syndrome case according to some example embodiments; and FIG. 42 is an example view illustrating a semiconductor package including a stack semiconductor chip according to some example embodiments.

DETAILED DESCRIPTION

Hereinafter, various example embodiments will be described clearly and in detail using the drawings so that a person of ordinary skill in the art may easily implement some inventive concepts.

Generally, error correction codes (ECC), based on information theory proposed by C. Shannon, are being researched to approach channel capacity. Error correction codes include techniques that uses parity bits to correct errors occurring during data transmission and reception. This technology has been utilized in various wireless communication fields to protect messages and has been adopted in the memory semiconductor field to correct and detect errors occurring in cells. Memory technologies like DRAM (Dynamic Random Access Memory) and/or SRAM (Static Random Access Memory) must transmit and store data accurately within a short period of time. Therefore, it is necessary or desirable to have fast data processing speed and/or high reliability. However, various errors occurring in memory cells can decrease the reliability of memory. For example in DRAM, linear block-based error correction codes with relatively few parity bits are being introduced to enhance reliability in environments with limited space and delay overhead. Typically, linear block-based error correction codes are employed in the fields of communication and data storage to ensure or improve the reliability of data. These linear block codes generate 'codewords' by combining additional parity bits, generated from data bits. This enables the detection and, when necessary or if possible, correction of errors occurring during data transmission or storage. The 'linear' characteristic signifies that linear combinations of codewords result in codewords. These codes are implemented in various forms (one or more of Parity Check, Hamming codes, Reed-Solomon codes, etc.) depending on their ability to identify and correct error locations.

The probability of errors occurring in typical memory devices is very low. Moreover, since errors mostly manifest as single-bit errors, linear block codes with SEC (single error correction) capabilities are being proposed. Recently, memory devices have been undergoing densification and low-power operation for performance improvement, which may lead to an increased likelihood of Multiple Bit Upset (MBU) errors within codewords. To correct or improve upon MBUs, linear block codes with SEC capabilities are being proposed, utilizing one or more of BCH (Bose-Chaudhuri-Hocquenghem) codes, RS (Reed-Solomon) codes, or inter-leavers to distribute and convert multiple errors into single errors, while maintaining SEC characteristics. However, linear block codes with high error correction capabilities generally come with substantial space overhead for parity storage. Additionally, there is significant latency overhead during decoding due to increased logic complexity. How-ever, MBUs primarily occur in a burst form from physically adjacent cells in memory devices. Thus, linear block codes that address burst errors while reducing or minimizing space and/or latency overhead are in demand.

In accordance with various example embodiments, a memory device, a memory system incorporating the memory device, and/or a method of operation thereof may support SEC-DED (Double Error Detection)-TAED (Triple Adjacent Error Detection) codes that map at least three types of errors to a single syndrome. Specifically, various example embodiments may enable DED by inserting additional rows into the parity check matrix (alternatively referred to as the H-matrix) of the error correction circuit supporting SEC/TAED.

In various example embodiments, SEC-DED-TAED codes may be configured in the H-matrix with columns arranged in an [even-odd-odd]pattern. Here, odd columns indicate that the number of ones in binary columns is odd. The i-th odd column can be designed by XOR-ing the (i−1)-th, (i−3)-rd, and (i−4)-th columns. In some example embodiments, SEC-DED-TAED codes may support both Non-Systematic Encoding (NSE) and Systematic Encoding. Systematic Encoding, in this context, indicates that input data is included in the encoded output. Generally, in com-mercial systems, Systematic codes that clearly distinguish codewords from data and parity are preferred. SEC-DED-TAED codes add all-1 rows to the H-matrix for DED.

In some example embodiments, SEC-DED-TAED codes may be designed for arbitrary message lengths. Additionally, SEC-DED-TAED codes of various example embodiments may reduce syndrome calculation complexity and latency.

Figure 1:
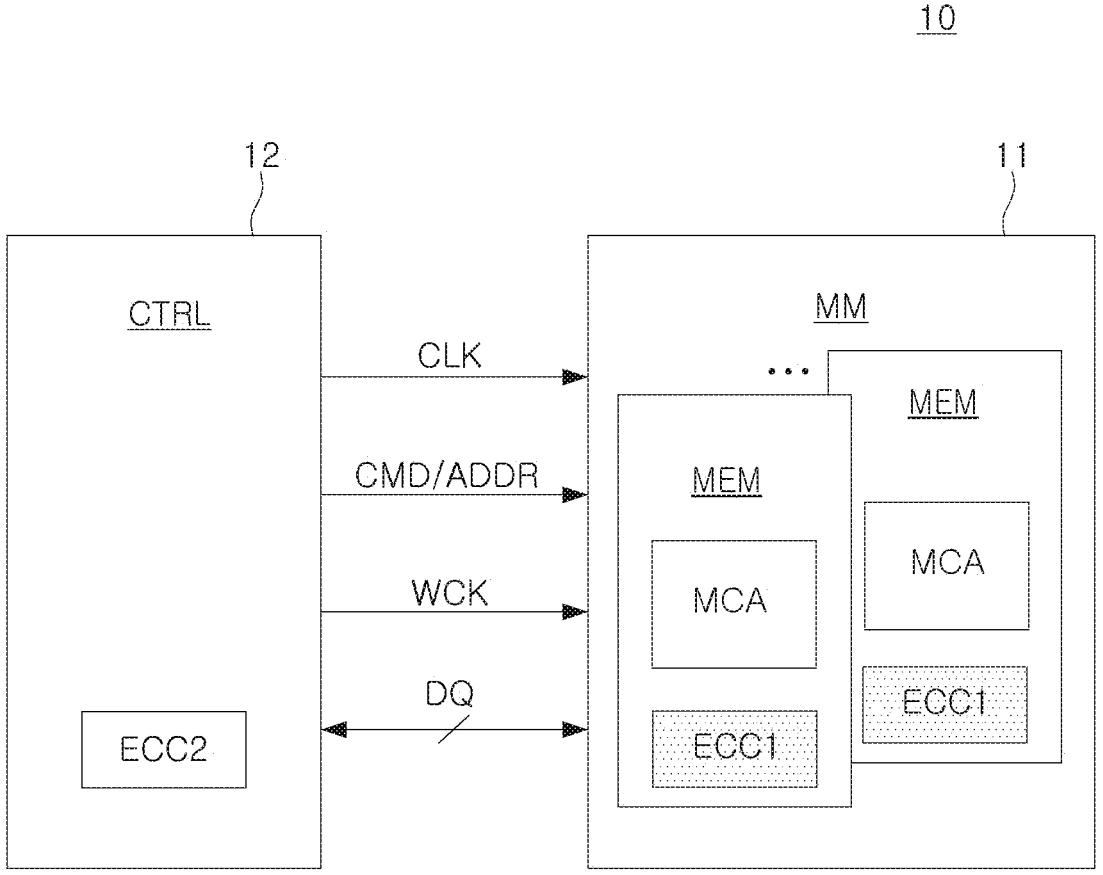
FIG. 1 is a view illustrating a memory system according to some example embodiments.

FIG. 1 is a view illustrating a memory system according to some example embodiments. Referring to FIG. 1, a memory system 10 may include a memory module MM 11 and a controller CTRL 12.

The memory system 10 may be implemented to be included in a personal computer and/or a mobile electronic device. The mobile electronic device may be implemented as one or more of a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile Internet device (MID), a wearable computer, an Internet of Things (IoT) device, an Internet of Everything (IoE) device, a drone, or the like.

The memory module MM 11 may include a plurality of memory devices MEM. In some example embodiments, the memory device MEM may be implemented as or may include a volatile memory device. The volatile memory device may be implemented as one or more of a random access memory (RAM), a dynamic RAM (DRAM), a static RAM (SRAM), or a low power double data rate (LPDDR) DRAM. In some example embodiments, the memory device MEM may be implemented as or may include a nonvolatile memory device. For example, the memory device MEM may be implemented as one or more of an electrically operable programmable read-only memory (EEPROM), a flash memory, an MRAM, an STT-MRAM, a ferroelectric RAM (FeRAM), a Phase change RAM (PRAM), a resis-tance memory (resistive RAM (RRAM), a nanotube RRAM, a polymer RAM (PoRAM), a nano floating gate memory (NFGM), a holographic memory, a molecular electronics memory device, or an insulator resistance change memory.

The memory device MEM may include a memory cell array including a plurality of memory cells connected to rows (word lines) and columns (bit lines), and a first error correction circuit ECC1 for correcting errors in data read from the memory cell array. In some example embodiments, the first error correction circuit ECC1 may include error correction units that perform error correction in different ways according to a physical location (or address). When a non-single bit error (NSB) occurrence location in data is varied for each fault according to a physical location in the memory device MEM, the memory device (MEM) may correct errors in an On-die Error Correction Code (OD-ECC), e.g., the first error correction circuit (ECC1) of the memory device 11, and/or may cause correction errors (mis-correction) of the OD-ECC to occur in a correctable range in the second correction circuit (ECC2, system ECC) of the controller 12.

The first error correction circuit ECC1 may be imple-mented to correct errors in the memory device MEM. The first error correction circuit ECC1 may include an error correction unit that receives an input of a physical location (e.g., a row address, a bank address, etc.) and performs encoding/decoding. In some example embodiments, the error correction unit may operate by the H-matrix. Here, the H-matrix is used to generate an error syndrome, e.g., an error vector, through multiplication with a codeword. The H-ma-trix may include a SEC-DED-TAED code that maps at least three types of errors into one (e.g., precisely one) syndrome.

In some example embodiments, the first error correction circuit ECC1 may perform one or more of a 1-bit error correction operation, a 2-bit error detection operation, or an adjacent 3-bit error detection operation using the H-matrix. Here, the H-matrix may be configured so that columns are arranged in an order of odd-odd-even degree, and a leading one (LO) of each column may be arranged in a stepped structure. In some example embodiments, the 1-bit error correction operation may be or may include or be included in a single error correction (SEC) operation, the 2-bit error correction operation may be or may include or be included in a double error detection (DED) operation, and the adja-cent 3-bit error correction operation may or may include or be included in be a triple adjacent error detection (TAED) operation. The first error correction circuit ECC1 may be implemented with a systematic code. In some example embodiments, the H-matrix may be implemented with a SEC-DED-TAED code based on an odd-order column, which may reduce decoding complexity and/or latency time.

The controller CTRL 12 may be implemented as one or more of an integrated circuit, a system on chip (SoC), an application processor (AP), a mobile AP, a chipset, or a set of chips. The controller 12 may include one or more of a random access memory (RAM), a central processing unit (CPU), a graphics processing unit (GPU), a natural process-ing unit (NPU), or a modem. In some example embodi-ments, the controller 12 may perform a function of a modem and a function of an AP.

The controller 12 may be implemented to control the memory module 11 to read data stored in the memory module 11 or to write data to the memory module 12. The controller 12 may provide a command CMD and an address ADDR to the memory module 11 in synchronization with a clock CLK, thereby controlling a write operation and/or a read operation with respect to the memory module 11. Furthermore, data DQ may be transmitted and received between the controller 12 and the memory module 11 in synchronization with a data transfer clock WCK. Furthermore, the controller 12 may include a second error correction circuit ECC2 for correcting an error of the data DQ transmitted and received with the memory module MM.

The memory system 10 according to some example embodiments may be implemented with several parity check matrices (PCM) for a specific message length. As a detection method for a double error, a code extension and code expurgation may be added. The PCM of various example embodiments may generate a code that satisfies the SEC-DED-TAED at all message lengths. Furthermore, the memory system 10 of various example embodiments may reduce increased space overhead and/or complexity due to a decoder of the SEC-DED-TAED code. A systematic code may be implemented at a specific message length for practical use of the SEC-DED-TAED code of example embodiments. Specifically, it may be possible to implement a systematic code having a local parity in which data and a parity are separated locally.

An error correction code of a general memory device encodes/decodes messages based on a linear block code. In this case, a vector generated during a decoding process is called a syndrome. Depending on how the syndrome is used, detection and correction capabilities for specific error patterns are determined. Below, only a binary linear block code is described. The binary linear block code includes a k dimensional subspace of n dimensional $$F_2^n.$$

Here, n is a block length, k is the message length, and $F_2=\{0,1\}$ is a size 2 (characteristic 2) of the Galois field. The remaining r=n−k is a parity length. A (n, k) block code is used by selecting $2^k$ codes from a vector space formed of $2^n$ points, each having a length of n. One linear block code C is generated by a k×n matrix G, called a generation matrix.

Figure 2:
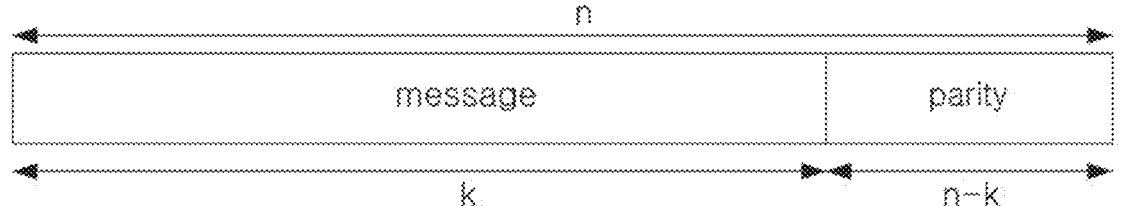
FIG. 2 is an example view illustrating a general linear block code.

FIG. 2 is an example view illustrating a general linear block code. Referring to FIG. 2, when there is a message m, a code c is defined as follows.

$$c = mG \qquad \text{Equation 1}$$

A generation matrix of a systematic code capable of distinguishing between a message bit region and a parity bit region within a code may be expressed as follows.

$$G = [I_k{:}P] \qquad \text{Equation 2}$$

Here, P is a binary k×(n−k) matrix, and $I_k$ is a k×k unit (identity) matrix. In the case of a systematic code, a parity check matrix (PCM) H may be easily found using a matrix, and is expressed as follows.

$$H = [P^T{:}I_{n-k}] \qquad \text{Equation 3}$$

Here, $(\bullet)^T$ denotes a transpose of the matrix. A size of the PCM H is (n−k)×n and the matrix satisfies $Hc^T=0$ with respect to all codes $c \in C$. By utilizing this feature, the PCM may detect an error included in a vector (y) received by passing through a channel.

Figure 3:
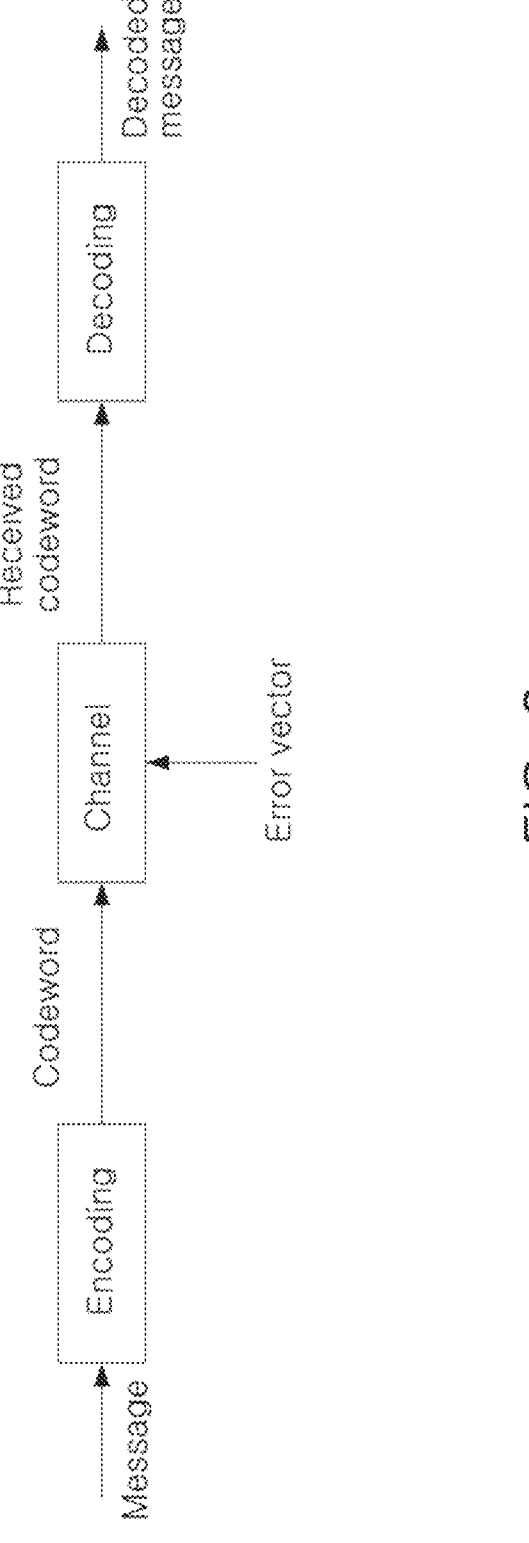
FIG. 3 is an example view illustrating a channel model of a general linear block code.

FIG. 3 is an example view illustrating a channel model of a general linear block code. A signal transmitted through a channel in consideration of a binary channel is expressed as follows.

$$y = c + e \qquad \text{Equation 4}$$

Here, e is a binary error vector, and + is an XOR (exclusive or) operation over $F_2$. In this case, the syndrome may be obtained as follows.

$$s = Hy^T = H(c + e)^T = He^T \qquad \text{Equation 5}$$

Accordingly, the syndrome $s \in$ $$F_2^{n-k}$$

may be obtained only through errors, regardless of the code. When there are no code errors received, the syndrome has s=0. The number of syndromes that a linear block code has is $2^{n-k}$. Because this is a smaller number than the number of all error patterns ($2^n$), not all errors can be corrected. Therefore, the syndrome corrects errors by assigning each syndrome as a target for errors that occur as often as possible among all error patterns. When f($\bullet$) is a table that maps error patterns and syndromes in advance, a decoding process is as follows. The syndrome is calculated through a received signal ($s=Hy^T \neq 0$). Then, the error pattern is estimated using Table f($\bullet$). Then, an error is corrected by adding an estimated error pattern to the received signal ($\hat{c}=y+\hat{e}$).

Error correction based on syndrome-error mapping may store mapping information in a table and may compare the mapping information with the syndrome to correct errors. For this reason, time overhead in a memory semiconductor may be reduced or improved upon.

Meanwhile, a syndrome-error mapping method may be used not only to correct errors but also to detect errors. When $$S = F_2^{n-k}$$

is a set of possible syndrome values, $S_c$ in S may be divided into a set of syndrome values used to correct a specific error pattern, and $S_d$ therein may be divided into a set of syndrome values used to detect a specific error pattern. When an intersection between two sets is ∅ or empty, correction and detection of each specific error pattern may be performed without mis-correction. When the syndromes for error detection and correction are separate from each other, a decoding process is as follows. The syndrome is calculated through a received signal ($s=Hy^T \neq 0$). If $s \in S_c$, errors are corrected through ê=f(s). If s∈S$_d$, the received signal is determined to have errors. Accordingly, using a syndrome-based error detection and correction method, it may be possible to more efficiently design a code for a targeted error pattern despite a limited parity length.

In general, a Hamming code is a code having single error correction ability among binary linear block codes. When there is a parity bit m, the Hamming code has a code length and message length of (n, k)=(2$^m$−1, n−m). The PCM of the Hamming code includes all 2$^m$−1 different vectors which are non-zero, as columns. e$_i$ is defined as a vector whose weight is 1. This corresponds to a vector representing an error at an i-th position in a code. When $$h_i^T$$

is an i-th column vector of a Hamming code PCM, a syndrome for a single error pattern may be obtained as follows.

$$s = He_i^T = [h_0^T, \ldots, h_i^T, \ldots, h_{n-1}^T]e_i^T = h_i^T \qquad \text{Equation 6}$$

Accordingly, in the Hamming code, a column vector of the PCM serves as a syndrome that corrects a single error at each position. As a result, when the column of the PCM has a different vector other than zero, the PCM may correct a single error by the number of columns.

Meanwhile, a Hsiao code may detect a double error as well as correcting a single error through a binary linear block code.

Figure 4:
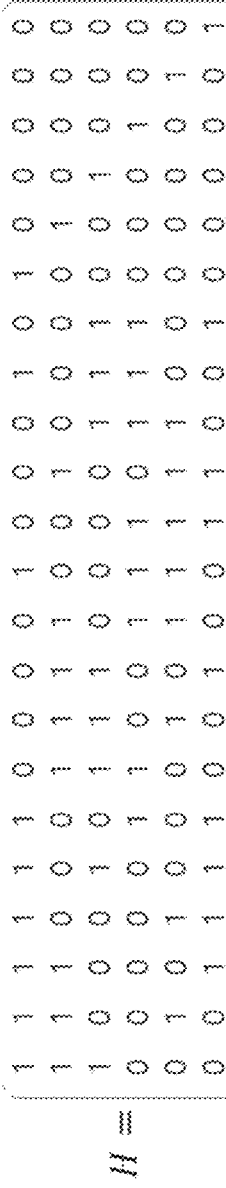
FIG. 4 is an example view illustrating a PCM of Hsiao SEC-DED (22, 16) code.

FIG. 4 is an example view illustrating a PCM of a Hsiao SEC-DED (22, 16) code. It may be confirmed that the corresponding code preferentially uses a vector in which a message bit is 16 bits, a parity bit is 6 bits, and a Hamming weight (or number of 1's) of each column vector in the PCM is 1 and 3. When the Hsiao code has the same message length as the Hamming code, the Hsiao code further uses one parity bit, but may detect double errors. A code design method first uses different vectors as columns of the PCM to have a single error capability. In this case, all Hamming weights of the column vectors have odd values. Accordingly, syndrome vectors (S$_{SE}$) for a 1-bit errors all have odd weights and match one of the columns of the PCM. An occurrence of the double error is expressed as e=e$_i$+e$_j$, and e$_i$ is a vector in which a vector weight is 1. In this case, a syndrome for the double error is expressed as follows.

$$S_{DE} = He^T = [h_0^T, \ldots, h_i^T, \ldots, h_{n-1}^T](e_i + e_j)^T = (h_i + h_j)^T \qquad \text{Equation 7}$$

Here, + denotes a binary XOR (exclusive or) operation, and a double error syndrome S$_{DE}$ is given as XOR operation values for different i-th and j-th column vectors, and in this case, when the XOR operation is performed on two vectors having an odd weight, the two vectors are always converted into an even weight. Accordingly, since a weight of a syndrome for all double errors is expressed to be even, and due to S$_{SE}$∩S$_{DE}$=∅ or the intersection being empty, the double errors are detected without mis-correction. Furthermore, in order to minimize or reduce the number of 1s of the PCM, among vectors having odd weights available for each column vector, a vector having the lowest weight is used first.

Meanwhile, a Dutta and Touba code has single error correction-double error detection (SEC-DED) performance.

Figure 5:
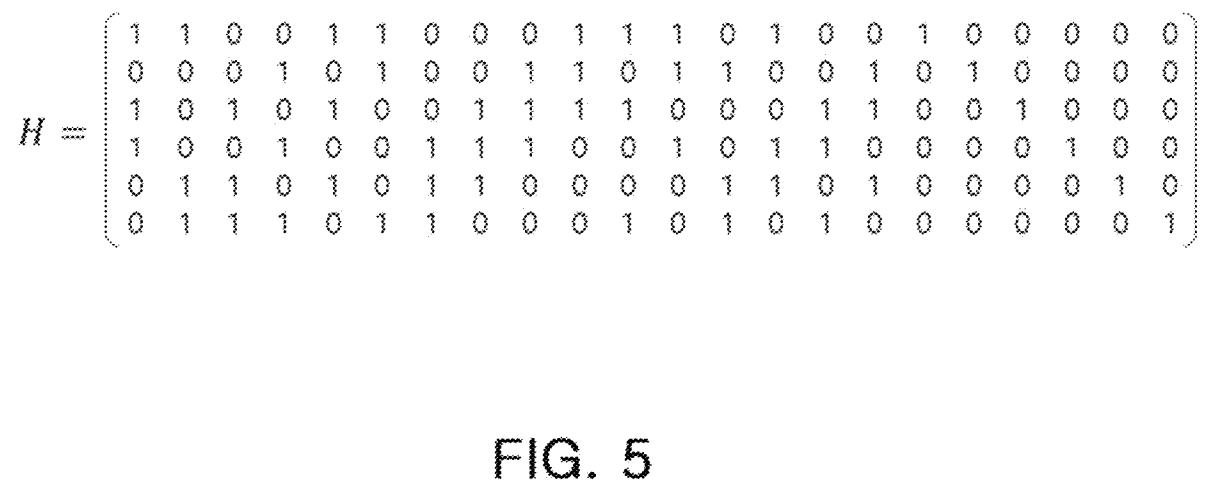

FIG. 5 is an example view illustrating a PCM of a (23, 16) Dutta and Touba SEC-DED-DAEC code. As illustrated in FIG. 5, weights of respective columns of the PCM are all odd and all satisfy the SEC-DED requirement on different columns.

Figure 6:
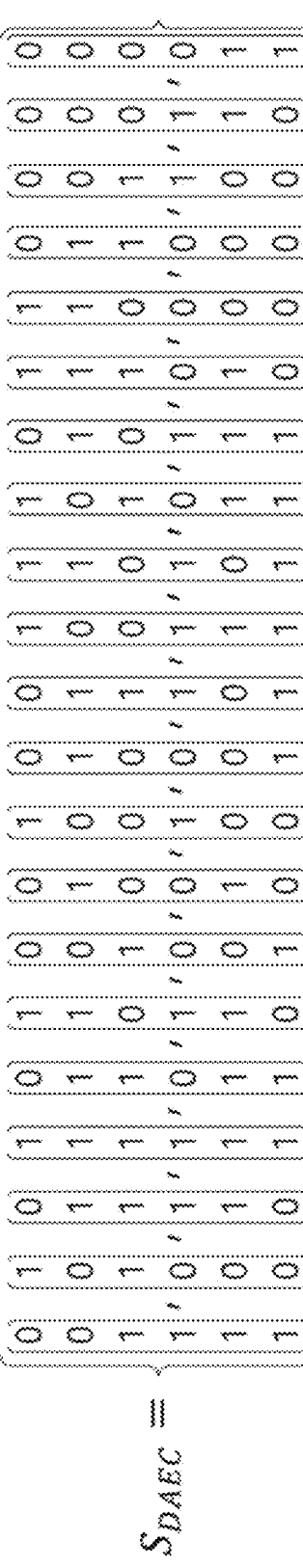
FIG. 6 is an example view illustrating a DAEC syndrome set of Dutta and Touba codes.

FIG. 6 is an example view illustrating a DAEC syndrome set of a (23, 16) Dutta and Touba code. As illustrated in FIG. 6, by matrixing the syndrome set of adjacent double errors, each column is different from each other as an element of an adjacent double error syndrome set. For this reason, the Dutta and Touba code may have double adjustment error correction (DAEC) performance as well as SEC-DED performance.

The Dutta and Touba code also has the DAEC performance by differentiating the syndrome for the adjacent double errors by appropriately arranging the column vectors of the PCM. Similarly to the Hsiao code, the Dutta and Touba code satisfies the SEC-DED by selecting different vectors having odd weights as a column vector of the PCM. In order to satisfy the DAEC, when a set of syndromes for the adjacent double errors is S$_{DAEC}$, elements of S$_{DAEC}$ are different from each other. Accordingly, a decoding process for double errors occurring in the received signal is as follows. A syndrome is calculated through the received signal (s=Hy$^T$≠0). A weight of the syndrome is confirmed, and when the weight is even, a double error occurrence is confirmed. If S∈S$_{DAEC}$, it is determined as an adjacent double error and errors are corrected through ê=f(s). If S∉S$_{DAEC}$, it is determined as a double error that is not adjacent to the received signal.

Meanwhile, a Reviriego code may also satisfy SEC-DED-DAEC, like the Dutta and Touba code.

Figure 7:
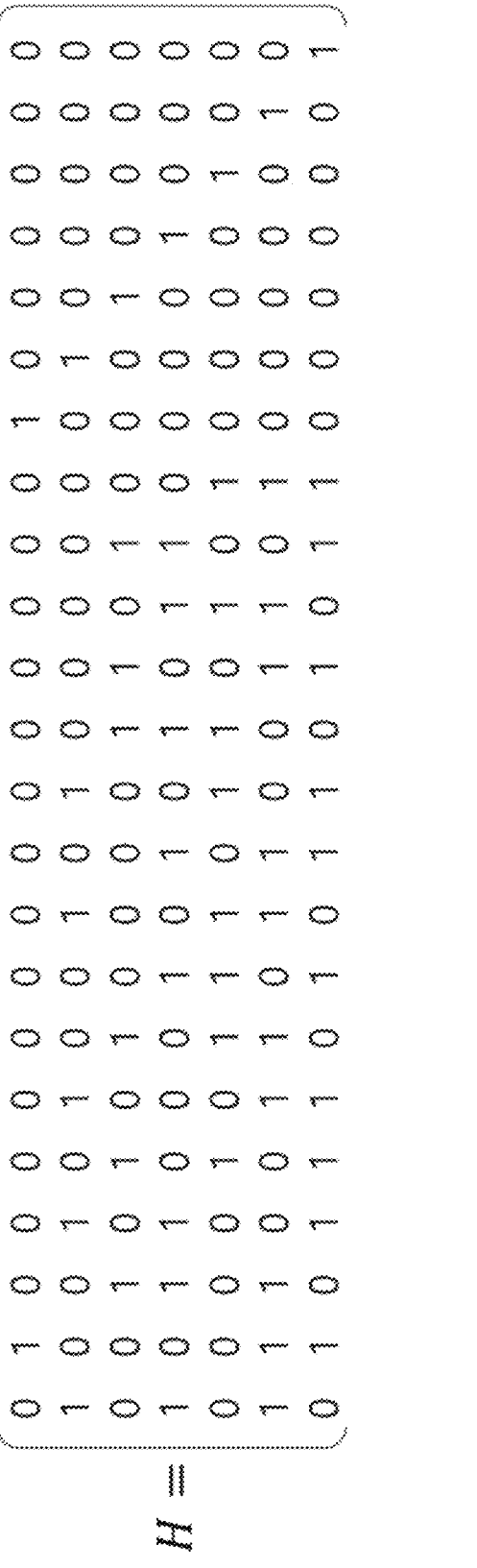
FIG. 7 is an example view illustrating a PCM of a Reviriego code.
Figure 8:
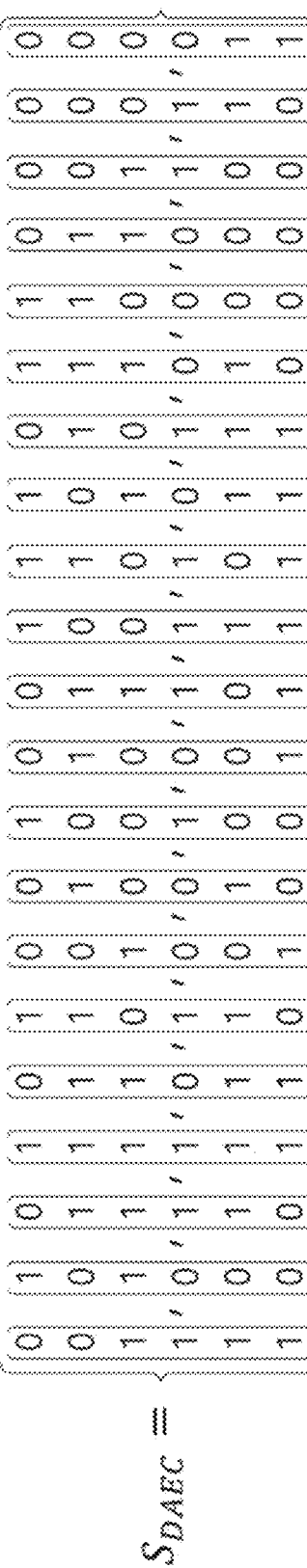
FIG. 8 is an example view illustrating a DAEC syndrome set of a Reviriego code.

FIG. 7 is an example view illustrating a PCM of a (23, 16) Reviriego code, while FIG. 8 is an example view illustrating a DAEC syndrome set of a (23, 16) Reviriego code. The Reviriego code uses a vector having an odd weight of the PCM, which is the same method as the Dutta and Touba, as each column, and a syndrome for adjacent double errors arranges columns differently, thus satisfying SEC-DED-DAEC performance. The Reviriego code has a faster decoding speed than the Dutta and Touba codes. The corresponding code constantly maintains a weight of a syndrome for adjacent double errors that may be obtained through a column in which a column weight is not 1. As a result, latency overhead may be lowered by reducing the number of logics required for decoding.

As illustrated in FIG. 8, a weight of an adjacent double error syndrome for a parity bit is 2 and a weight of an adjacent double error syndrome for an information bit is 4, where each weight has the same value. In this case, for decoding performance, the Reviriego code uses one more bit of parity than the Dutta and Touba code, so that there is a code having a longer parity length as compared to the same error correction performance.

On the other hand, a Sánchez code satisfies SEC-DED-TAED by appropriately using a vector having an even weight, rather than constructing a PCM using only a vector having an odd weight for error patterns other than a single error.

Figure 9:
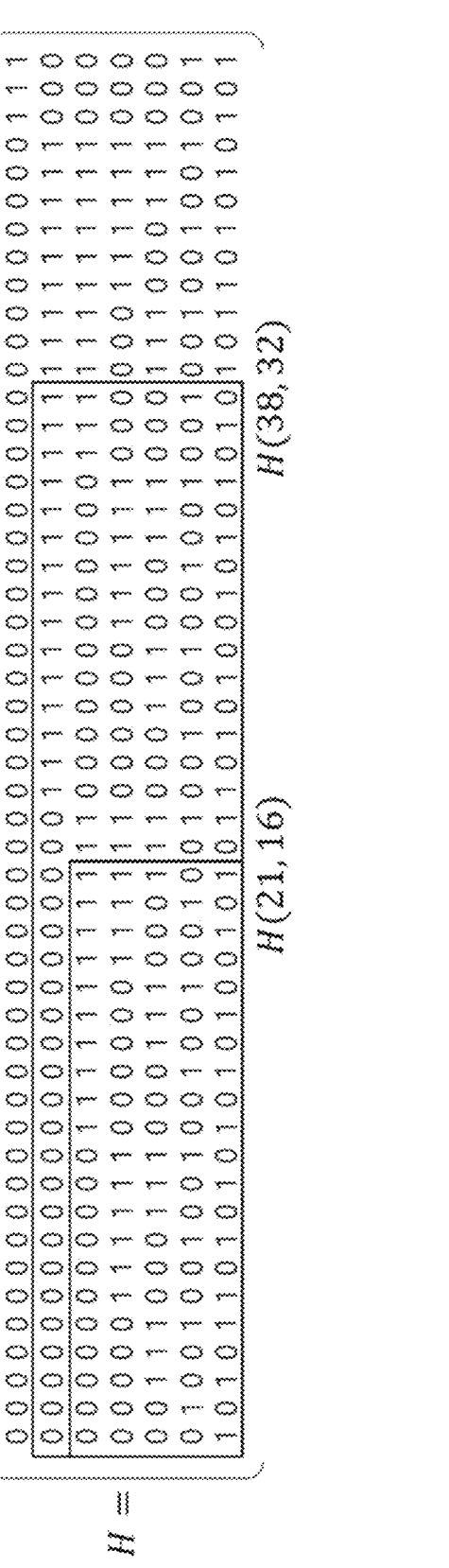
FIG. 9 is an example view illustrating a PCM of an SEC-TAED Sánchez code.

FIG. 9 is an example view illustrating a PCM of a (50, 43) SEC-TAED A. Sánchez code. As illustrated in FIG. 9, SEC-TAED codes having message lengths of 16 and 32, which are lower than a message length of 43, may be obtained from the Sánchez (50, 43) SEC-TAED code.

Figure 10:
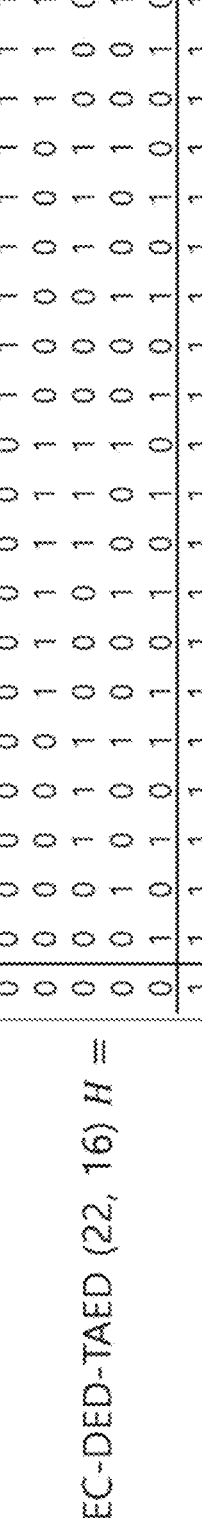
FIG. 10 is an example view illustrating a PCM of a SEC-DED-TAED Sánchez code.

FIG. 10 is an example view a PCM of a (22, 16) SEC-DED-TAED Sánchez code. As illustrated in FIG. 10, the (22, 16) SEC-DED-TAED code obtains a submatrix, (21, 16) SEC-TAED, and additionally supports DED through an extension to form a PCM.

In a binary vector, a leading one (LO) refers to the most advanced 1 (or the most significant index with a value of 1). It is assumed that the number of elements from LO to a vector end within a determined vector is an LOD (Leading One's Depth). For example, the LOD of (0 0 1 1 0 1) is 4. Each column vector in the PCM repeatedly enumerates columns having odd-odd-even weights, using a vector with the lowest LO (leading one) from the left. In this case, an LOD of an i-th positioned vector is greater than or equal to an LOD of i-1th column vectors. Furthermore, a weight of a syndrome for adjacent 3-bit errors is even. For this reason, SEC-TAED is satisfied if the column vector is appropriately arranged so that it is different from a column vector having an even weight in the PCM. When an all-0 column is added to the left of the PCM to the PCM satisfying the SEC-TAED, and then an all-1 row is added to a lowermost portion, an extended code is obtained. When confirming a syndrome for a double error, a double error is detected by confirming a last bit of the syndrome.

When a received code includes errors, a correction and detection method may be as follows. A syndrome is calculated from the received signal $(s=Hy^T \neq 0)$. When a last bit of s is 0, the error is determined as a double error. When the last bit of s is 1 and $s \in S_{SEC}$, the error is corrected through $\hat{e}=f(s)$. When the last bit of s is 1 and a weight of s is odd, ifs $S_{SEC}$, the error is determined to be an error in three adjacent bits.

A general Sánchez code has SEC-DED-TAED performance and allows for a code design for all message lengths. However, because an extension is used in a PCM design process, as an all-1 row is added, the number of 1s in a total PCM increases, thus significantly increasing latency overhead. Furthermore, because columns corresponding to a parity in the PCM as well as a systematic code are not gathered together, the Sánchez code has a distributed parity. Because rearrangement of columns cannot be applied due to a PCM structure to respond to TAE, it may be difficult to simply performing conversion into a code having a localized parity.

A SEC-DED-TAED code according to some example embodiments has a code length that can be generated depending on a parity length. A memory device mainly uses a message length of $2^k$ (where k is a positive integer), but requires various message lengths in certain situations. Various example embodiments may secure a submatrix according to a target message length through SEC-TAED PCM, generate SEC-DED-TAED code PCM through extension/expurgation, and/or reduce an overall weight of the PCM by modifying SEC-DED-TAED PCM generated for use in the memory device. Accordingly, various example embodiments may improve upon or reduce space and/or latency overhead. Alternatively or additionally, a code may be easily implemented by generating the code into a systematic code having a localized parity.

Various example embodiments may design a SEC-DED-TAED code for all message lengths. For this purpose, example embodiments may be designed with SEC-DED-TAED through two processes. First, the SEC-TAED codes are designed and DED properties are added through code modification. In order to design a code satisfying SEC-TAED, two conditions need to or are expected to be satisfied. First, respective column vectors in the PCM are different vectors that are not 0. Second, syndrome vectors of three adjacent error vectors must not match an element of a single error syndrome set. A first condition is a condition for correcting a single error, and each column vector of the PCM may be used as a syndrome for a single error. Because a proposed SEC-DED-TAED code only corrects the single error and only considers detection of adjacent 3-bit errors, TAED may be satisfied through the second condition by allowing overlap between TAE syndromes.

AN SEC-TAED PCM generation algorithm is sequentially generated in block units from 1 to a parity length $(r_M)$ input by the LOD. First, an integer $b \in [2^l]$ is expressed in binary as $\langle b \rangle =(b_{l-1}, \ldots, b_0)^T$, where $b_i$ is a coefficient of binary representation of b. When the LOD is l, $b_{l-1}$ is always 1 and a set of vectors therefor may be expressed as follows.

$$F_l = \{ \langle 2^{l-1} \rangle, \ldots, \langle 2^l - 1 \rangle \} \qquad \text{Equation 8}$$

A block $(B_l)$ is generated using $F_l$, through which abase matrix $(H_{base})$ is expressed as follows.

$$H_{base} = [B_1 \ \ldots \ B_{l-1}B_lB_{l+1} \ \ldots \ B_{r_M}] \qquad \text{Equation 9}$$

Assuming $$B_l = [b_0^T, \ b_1^T, \ \ldots, \ b_{L-1}^T], \ b_i^T$$

is a syndrome for a single error, and a syndrome for a TAE in the same LOD may be obtained as $$s_3 = b_i^T + b_{i+1}^T + b_{i+2}^T.$$

In this case, even if $$b_{-2}^T \text{ and } b_{-1}^T,$$

which are elements of adjacent $B_{l-1}$, are included, a TAE syndrome in which an LOD as $$s_{-2} = b_{-2}^T + b_{-1}^T + b_0^T$$

is l may be obtained. Similarly, there are $b_0$ and $b_1$, elements of $B_l$, but a coefficient of LO 1 becomes 0 by a sum of these vectors, and an LOD of $$s_{-1} = b_{-1}^T + b_0^T + b_1^T$$

becomes l−1. It may be confirmed that an LOD of $s_{L-2}$ is l−1 even in $B_l$ and $B_{i+1}$. Accordingly, when the LOD is l, a syndrome set for a single error is $S_{SEC}$, and a syndrome for an adjacent 3-bit error is $S_{TAED}$ as follows.

$$S_{SEC} = \{b_i^T | 0 \leq i \leq L - 1\} \qquad \text{Equation 10}$$

$$S_{TAED} = \{s_{-2}, s_0, s_1, \ldots, s_{L_r-3}, s_{L-1}\}$$

To this end, $H_{base}$ always satisfies the following condition when an i-th column vector of the PCM is $h_i$ in a case in which an order of each column vector is formed so that weights of a vector are listed by repeating odd-odd-even from the left.

$$w(h_i + h_{i+1} + h_{i+2}) \text{ is even, } (1 \leq i \leq n - 2) \qquad \text{Equation 11}$$

Here, $w(\bullet)$ represents a weight (a Hamming weight) of $\bullet$, + in the equation means an XOR operation (or addition modulo 2), and n means a length of a code. Accordingly, a weight of a syndrome vector for all TAEs is even, and because $S_{SEC} \cap S_{TAED} \neq \emptyset$ must be satisfied, elements of $S_{SEC}$ and $S_{TAED}$ must not match each other.

$$s_{SEC} \neq s_{TAED}(s_{SEC} \in S_{SEC}, s_{SEC} \in S_{TAED}) \qquad \text{Equation 12}$$

Among the elements of $F_l$, a total number of vectors having an odd weight is $2^{l-2}$, and to always make a weight of a TAE vector even when using all of these vectors, $2^{l-3}$ vectors having an even weight are required. In order to prevent the elements of the TAE syndrome set generated thereby from belonging to $S_{SEC}$, when all the syndromes for TAE are comprised of the remaining $2^{l-3}$ vectors, a length of each block may be designed to a maximum. Accordingly, a maximum length of a code satisfying SEC-TAED with respect to a parity length ($r_M$, $r_M \geq 2$) may be obtained as follows in consideration of excluding a vector 0.

$$n_{max} = 3 \cdot 2^{r_M-2} - 1, (r_M \geq 2) \qquad \text{Equation 13}$$

$H_{base}$ is configured by connecting consecutive blocks and when an LOD is 1, because only $F_1 = \{\langle 1 \rangle\}$ is present, $H_{base}$ is fixed to $B_1 = [\langle 1 \rangle]$ and has an odd weight. $B_2$ is configured through $F_2 = \{\langle 2 \rangle, \langle 3 \rangle\}$ and for TAED performance of $H_{base}$, a weight of an element of $B_2$ must be configured in an order of odd and even, and thus, $B_2$ may be comprised of $B_2 = [\langle 2 \rangle, \langle 3 \rangle]$. However, for $[\langle 1 \rangle, \langle 2 \rangle, \langle 3 \rangle]$, a syndrome for TAE may become $\langle 0 \rangle$, and may result in mis-correction that there is no error during decoding. Accordingly, $B_1$ and $B_2$ are fixed to $B_1 = [\langle 1 \rangle]$ and $B_2 = [\langle 2 \rangle]$, and a weight of a first column of $B_3$ is chosen as a vector being even. Because the number of columns of $B_l$ relative to LOD 1 in a design method for blocks is $2^{l-2} + 2^{l-3} = 3 \cdot 2^{l-3}$ and is a multiple of 3, a weight of a column of the block is repeatedly listed in an order of even-odd-odd, so that a weight of a first column of blocks for an LOD being $l \geq 3$ is always even.

When designing the SEC-TAED PCM code, elements of $F_l$ are classified as follows because a selection is made based on the weight of the vector. $O_l = \{\langle j \rangle | 2^{l-1} \leq j < 2^l, w(\langle j \rangle) \text{ is odd.}\}$, $E_l = \{\langle j \rangle | 2^{l-1} \leq j < 2^l, w(\langle j \rangle) \text{ is even.}\}$ A column of block $B_l$ is selected using elements of $O_l$ and $E_l$. In this case, if $S_{SEC} \cap S_{TAED} \neq \emptyset$ is provided by confirming an SE syndrome and a TAE syndrome generated by a newly selected vector, it may be selected as a column of a block. However, when this method is utilized, before a length of a block becomes L, a design may be stopped by using all elements of $E_l$ in $S_{SEC}$ and $S_{TAED}$. To prevent this phenomenon, the following rule is used when selecting a vector $$\left(a_o^T\right)$$

having an odd weight in a block.

$$a_o^T \in O_r \qquad \text{Equation 14}$$

$$b_{i-4}^T + b_{i-3}^T + b_{i-2}^T =$$

$$b_{i-2}^T + b_{i-1}^T + a_o^T = s_{TAED} \in S_{TAED} <=> a_o^T = (b_{i-1}^T + b_{i-3}^T + b_{i-4}^T)$$

$$b_i^T$$

denotes an i-th column vector of $B_l$, and an element of $O_l$ may be selected as $$b_i^T$$

of $B_l$ through a binary sum of vectors of $B_l$. Furthermore, since $S_{TAED}$ including $$b_i^T$$

is already included in $S_{TAED}$, an element of additional $E_l$ is not used. A vector $$\left(a_e^T\right)$$

having an even weight is randomly selected from $E_l$. Since a syndrome for a TAE generated thereby is $$S_{TAED} = b_{i-2}^T + b_{i-1}^T + a_e^T$$

and $s_{TAED} \notin S_{TAED}$, $$a_e^T$$

is $$b_i^T,$$

which is included in $B_l$, and $S_{TAED}$ is included in $S_{TAED}$, and excluded from $E_l$. Since a column corresponding to the even weight is randomly selected, multiple SEC-TAED PCMs may be obtained through an algorithm, and the number thereof is as follows for an input parity length ($r_M$).

$$\prod_{\alpha=3}^{r_M} \prod_{\beta=0}^{2^{\alpha-3}-1} (2^{\alpha-2} - 2\beta), \ (r_M \geq 3).$$

Equation 15

Here, j is the number of even weight vectors used in an SEC-TAED PCM. When a code length (n) is determined to match a target message length (k), a submatrix ($H^s$) may be generated through $H_{base}$.

FIG. 11 is an example view illustrating an algorithm for generating SEC-TAED codes depending on an input parity length according to some example embodiments of various example embodiments. Various example embodiments may generate a SEC-DED-TAED code through a two-step process. In the first process, an SEC-TAED PCM according to a parity length ($r_M$) may be generated to generate a submatrix $$\left( H^s_{k_s} \right)$$

having an SEC-TAED function according to a target message length. In the second process, 1-bit parity is added to $$H^s_{k_s}$$

for DED. While adding an all-1 row below a PCM, a last bit of a non-zero syndrome is confirmed and determined as a double error if the last bit is 0. Expurgation and extension exist as DED implementation methods. A size of a submatrix required for each method is varied. Accordingly, after considering the submatrix according to each method, the SEC-DED-TAED code is completed by using the method. The expurgation method adds a DED property by converting a message bit into a parity when there is a code having a code length of n in a binary linear block code. Accordingly, when the SEC-DED-TAED code is (n, k), a message length of the SEC-TAED codes have $k_s$ and have a relationship of $k_s=k+1$ with respect to a target message length k. In this case, a code length of the SEC-TAED is $n_s=n$, which has $n_s=k_s+r_s$. In the $H_{base}$ generated therefrom, the submatrix $$\left( H^s_{k_s} \right)$$

of the SEC-TAED codes for expurgation is configured. Since a size of $$H^s_{k_s}$$

is ($r_s \times n_s$), the submatrix is configured to match the LOD to $r_s$. When the expurgation is performed on the submatrix, the SEC-DED-TAED code with $$H^p_k$$

being $r=r_s+1$ and k being a target message may be obtained as a parity length.

Figure 12:
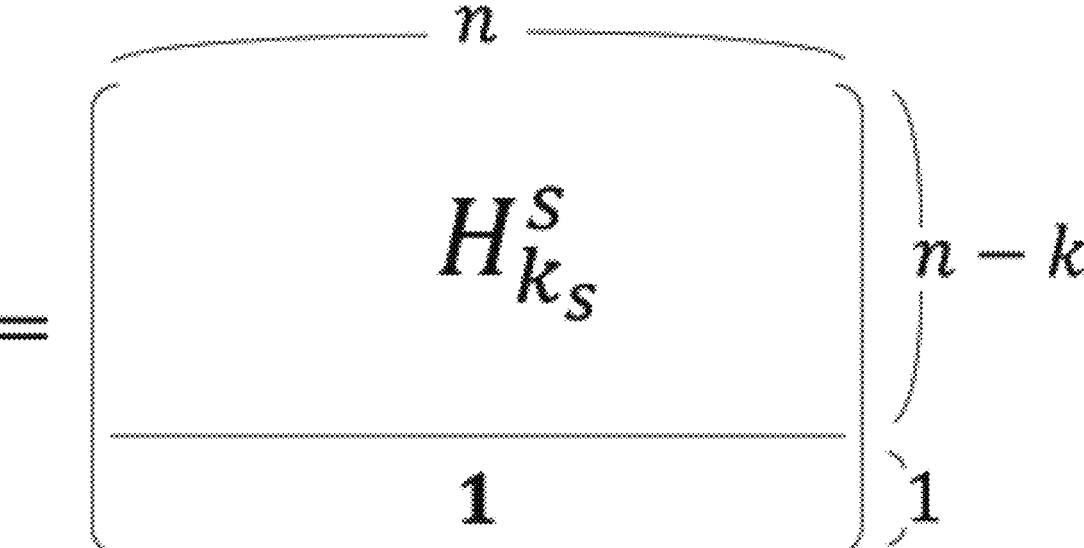
FIG. 12 is a view illustrating PCM $$H_k^p$$

FIG. 12 is a view illustrating PCM $$H^p_k$$

of a SEC-DED-TAED code through expurgation by PCM $$H^s_{k_s}$$

from a PCM perspective. The PCM subjected to the expurgation is a form obtained by adding an all-1 row at a lowermost portion of $$H^s_{k_s}.$$

An extension method adds a DED property by adding a parity in a binary linear block code. Accordingly, when the SEC-TAED code is ($n_s$, $k_s$), a message length of a SEC-DED-TAED code is $k=k_s$. When the SEC-TAED code is subject to the extension method, the parity becomes $r=r_s+1$ and a length of the SEC-DED-TAED code is $n=n_s+1$. Based on this, the SEC-TAED code $$\left( H^s_{k_s} \right)$$

considering the extension is obtained, and the SEC-DED-TAED code PCM( $$\left( H^e_k \right)$$

) is obtained through the extension method.

FIG. 13 is an example view illustrating PCM $$H^e_k$$

of a SEC-DED-TAED code through an extension by PCM $$H^s_{k_s}.$$

An all-1 column added during the extension adds a DED property while adding all-1 rows regardless of whether it is added to either side of the PCM. A Sánchez code uses a left extension in which a TAE syndrome added by arranging a $(00 \ldots 01)^T$ column to the left is fixed to $(00 \ldots 111)^T$. If the $(00 \ldots 01)^T$ column is arranged to the right, a weight of a TAE syndrome generated when weights of last two columns of $$H^s_{k_s}$$

are odd-even and even-odd may have even and may match a column of completed SEC-DED-TAED code PCM, which may cause mis-correction.

An error correction and detection method of the SEC-DED-TAED code completed by using expurgation and extension in the SEC-TAED codes, respectively, uses the same method as the Sánchez code. A syndrome is calculated through the received signal (s=Hy$^T$≠0). If a last bit of s is 0, it is determined as a double error. If the last bit of s is 1 and s∈S$_{SEC}$, an error is corrected through ê=f(s). If the last bit of s is 1 and s∈S$_{TAED}$, it is determined as an error in three adjacent bits.

When designing the SEC-TAED PCM, a weight of an adjacent 3-bit error syndrome is set to even. However, since an all-1 row is added for the DED, a weight of a syndrome for the TAE in a SEC-DED-TAED code is changed to odd.

Decoding performance of an error correction code based on a binary linear block is affected by the number of 1s of the PCM. A total number of 1s in the PCM affects space overhead. The maximum number of 1s per row affects latency overhead. The PCM of the SEC-DED-TAED code with the DED added through the expurgation and extension has high space and latency overhead due to the all-1 row. To solve this problem, a method of lowering the density of the PCM to lower the decoding complexity and latency but using a modified syndrome decoding accordingly is proposed. This operation is equally applied to the expurgation and extension and applied to the completed SEC-DED-TAED code. Through the following process, a total number of 1s in the PCM and the number of 1s in the all-1 row are reduced. After r−1 rows are added from above, they are added to a last row. All columns have even parity.

A PCM generated through an elementary row operation still maintains a SEC-DED-TAED property. Furthermore, decoding latency may be reduced by reducing a weight of the all-1 row. However, the double error detection method through confirming a last bit of the syndrome is not available because it is not an all-1 row. Accordingly, by taking advantage of the fact that the weights of each column vector of the PCM are all odd, when the syndrome is not a zero vector, the weight of the syndrome is confirmed, and when the weight of the syndrome is confirmed to be even, it is detected as a double error. Accordingly, the error correction and detection method for SEC-DED-TAED proceeds in the following order. The syndrome s=Hy$^T$ is calculated. If s=0, the code is determined to be valid. If s∈S$_{SEC}$, a single error correction is performed through ê=f(s). If the weight is even in a state of s≠0, it is determined that a double error has occurred. If s∈S$_{TAED}$, it is determined that an adjacent triple error has occurred.

FIG. 14 is an example view illustrating low complexity of a (39,32) SEC-DED-TAED code subjected to expurgation. In a SEC-DED-TAED code having a code length of 39, in a last row with low complexity, the number of 1s is 13 and a maximum length per row is 22, which may be reduced by 17 times as compared to a previous one, thereby reducing latency overhead.

Due to low complexity in a SEC-DED-TAED code having a code length of 39, the number of 1s is 13 and the maximum length per row is 22, which may reduce latency overhead by 17 times.

An encoding of systematic with localized parity of a binary linear block code is a decisive factor in using error correction code in actual memory environments. In a code that is systematic and has localized parity, a P$^T$ portion corresponding to a message and a I$_{n-k}$ portion corresponding to a parity like H=[P$^T$:I$_{n-k}$] as a form of the PCM are distinguished from each other. When a message and parity are distinguished from each other, a generation matrix G=[I$_k$:P] for performing the encoding using the PCM may be easily obtained. However, the SEC-DED-TAED code, which was previously designed in addition to a code proposed by Sánchez, has a form in which a parity is distributed. In this case, when column permutation is performed, TAED performance cannot be maintained and a form of H=[P$^T$:I$_{n-k}$] cannot be generated through the elementary row operation. Accordingly, some examples may further propose a method in which the SEC-DED-TAED code obtained through the existing design method is a localized parity while maintaining a stepped structure. The corresponding method configures SEC-TAED code PCM $$H_{k_s}^s$$

in consideration of a right extension in H$_{base}$ of an SEC-TAED code. A column is reselected using a vector not used in $$H_{k_s}^s$$

so that a submatrix having a right (r$_s$×r$_s$) size of $$H_{k_s}^s$$

is a full rank. Accordingly, when a rank of the submatrix achieves the full rank, it may be possible to obtain a I shape through right diagonalization.

FIG. 15 is a view conceptually showing the use of a SEC-DED-TAED code having a localized parity according to some example embodiments. Referring to FIG. 15, the PCM obtained by performing a process of decreasing a PCM weight after the right extension in the generated SEC-TAED code is used for decoding, and is used for encoding by obtaining a generation matrix through the PCM(H') having the I shape through diagonalization.

In general, since most message lengths mainly used in a memory system use 2$^α$ (where α is a natural number, α≥4), an additional design is performed with the aim of a localized parity of the SEC-DED-TAED code for this length. The localized parity denotes that consecutive column vectors corresponding to the parity of the PCM are gathered together to form a submatrix. If this submatrix is diversified, it becomes an I matrix. A right square matrix of SEC-DED-TAED code PCM is defined as a submatrix (H$_{sub}$), and the following condition is required for the encoding of the systematic with localized parity.

$$\text{rank}(H_{sub}) = r \qquad \text{Equation 16}$$

Here, r is a parity length of the SEC-DED-TAED PCM for a target message length, and H$_{sub}$ is a matrix that is (r×r) in the SEC-DED-TAED code PCM. A rank is a value of determining whether each vector in the matrix is independent of each other. If there are three vectors that are independent of each other in a (4×4) matrix, the rank is 3. If the rank of a matrix as (r×r) is r, this means that all the vectors in the matrix are independent of each other, and this is called a full rank. If the matrix is the full rank, during diagonalizing, the vectors of the matrix operate with each other and zero vectors are not be produced so that the I shape may be generated.

According to some example embodiments, the SEC-DED-TAED code may be generated by generating SEC-TAED codes and then supporting DED. In this case, since the matrix corresponding to both information bits does not circulate in the code, $H_{sub}$, which achieves the full rank for the localized parity, must be at both ends of the SEC-DED-TAED code PCM. A design of the SEC-TAED codes is performed in block units according to the LOD. Because a submatrix of a size $(r_s \times r_s)$ in which the LOD includes columns lower than $r_s$ includes an all-0 row, when calculating the rank, the full rank cannot be obtained. Accordingly, $H_{sub}$ is present at a right end of the SEC-DED-TAED code PCM.

FIG. 16 is an example view illustrating a SEC-DED-TAED code PCM in which $H_{sub}$ includes two all-1 rows. A DED support method includes an expurgation method and an extension method, and the extension method includes a left extension method and a right extension method according to a position of an all-0 column vector. In this case, in the case of the expurgation method, DED characteristics may be implemented by adding only all-1 rows without adding columns. Accordingly, when a submatrix $$\left( H_{sub}^{SEC-TAED} \right)$$

for a full rank is formed on the right side of the SEC-TAED code PCM, as illustrated in FIG. 16, there may be two all-1 rows. In this case, the full rank may not be achieved. Similarly, to the expurgation method, there are cases in which the full rank may not be achieved in a left extension. Accordingly, the right extension is used as a method for DED properties in the SEC-DED-TAED code for the localized parity. The full rank may be achieved by preventing the SEC-DED-TAED code PCM from having two all-1 rows in $H_{sub}$ through a $(00 \ldots 01)^T$ column added when the right extension is performed. In this case, weights of two right columns of the SEC-TAED code PCM are odd-odd. For this reason, when configuring $$H_{k_s}^s,$$

this is taken into consideration and a design is conducted to achieve full rank.

In a method of supporting DED through the right extension, when configuring a systematic code, $$H_{sub}^{SEC-TAED}$$

of $(r_s \times r_s)$ is configured in SEC-TAED PCM. When $$H_{sub}^{SEC-TAED}$$

is configured so that a rank satisfies $r_s$ on a rightmost side of the SEC-TAED PCM, $(r \times r)$ $H_{sub}$ of the SEC-DED-TAED code PCM including an all-1 row and a $(00 \ldots 01)^T$ column by extension is configured so that the rank is r. If this PCM is diagonalized, in the PCM, a part corresponding to an information bit and a part corresponding to a parity are distinguished from each other. This may be used to generate a generation matrix and to encode and transmit data bits from memory without an additional operation.

In order to generate the SEC-DED-TAED PCM into a code having a localized parity, a submatrix whose rank is a full rank must be generated in the SEC-TAED PCM. For this purpose, a portion of a column vector corresponding to $$H_{sub}^{SEC-TAED}$$

is reselected. The SEC-TAED codes are first designed according to a SEC-DED-TAED code design and bits are added to support the DED, there completing the SEC-DED-TAED code. Accordingly, this is taken into consideration, and the size of $$H_{sub}^{SEC-TAED}$$

for calculating a rank in the SEC-TAED code is set to $(r_s \times r_s)$ which is 1 smaller than a parity length (r) of the SEC-DED-TAED code, the rank may be set to $r_s = r - 1$.

Because the ability for the SEC-TAED must be maintained even in the process of reselecting the column vector, a structure of the SEC-TAED PCM must be maintained. For facilitating the design, a PCM is generated only as long as an SEC-TAED code length considering a target message length (k) and the right extension. Additionally, the rank is calculated whenever the column vector corresponding to $$H_{sub}^{SEC-TAED}$$

is selected. While maintaining SEC-TAED properties using vectors that do not correspond to $S_{SEC}$ and $S_{TAED}$, it is confirmed whether the rank increases whenever the column vector is selected. When an increase in the rank is confirmed, a new selected vector is used as a column of the PCM. Accordingly, when the SEC-TAED PCM is finally completed, the rank of $$H_{sub}^{SEC-TAED}$$

becomes $r_s$, and when performing the extension, a rank of submatrix $H_{sub}$ of the SEC-DED-TAED is $r = r_s + 1$.

This process may be summarized or generally described as follows. The SEC-TAED PCM having a parity length of $r_s$ through an SEC-TAED PCM design algorithm is generated, $$H_{k_s}^s$$

is configured from $H_{base}$ in consideration of a target message length and the right extension, submatrix $$H_{sub}^{SEC-TAED}$$

of a right $r_s$ size of $$H_{k_s}^s$$

is configured, a column of $$H_{sub}^{SEC-TAED}$$

for the full rank is selected using vectors excluding vectors included in $S_{SEC}$ and $S_{TAED}$, and the rank is calculated when the column of $$H_{sub}^{SEC-TAED}$$

is selected, and then, when increasing the rank, a corresponding vector is determined as a column. The process is advanced to achieve the full rank while maintaining the SEC-TAED. When $$H_{sub}^{SEC-TAED}$$

achieves the full rank, the right extension is performed for the DED to complete the PCM of the SEC-DED-TAED code.

According to some example embodiments, except for vectors used for single error correction and adjacent 3-bit error detection in order to generate the SEC-DED-TAED code while having the localized parity, the remaining vectors are used to achieve the full rank.

In some cases, a rank of $$H_{sub}^{SEC-TAED}$$

may not be achieved at a full rank even if vectors not included in $S_{SEC}$ and $S_{TAED}$ are used. When the message length is 16, if $$H_{k_s}^s$$

is configured from $H_{base}$, the number of vectors that do not correspond to S_SEC and S_TAED is 2. By utilizing this, the full rank of $$H_{sub}^{SEC-TAED}$$

cannot be achieved. among the vectors having the highest LOD in $H_{base}$, a vector having an odd weight is replaced while maintaining SEC-TAED performance so that the rank of $$H_{sub}^{SEC-TAED}$$

may be a full rank while keeping the parity length the same.

Various example embodiments may achieve a full rank while maintaining the structure of the PCM to generate an SEC-TAED code having a localized parity, and proposes a SEC-DED-TAED code through the right extension. FIG. 17 is a view illustrating $$H_{k_s}^s$$

when a message length generated through an SEC-TAED design method is 16. FIG. 18 illustrates a view illustrating a PCM of an SEC-TAED code in which $$H_{sub}^{SEC-TAED}$$

is a full rank when a message length is 16. A vector having an odd weight in which an LOD is 5 may be exchanged to generate an example illustrated in FIG. 18. Accordingly, the rank of $$H_{sub}^{SEC-TAED}$$

may achieve the full rank, and generate a SEC-DED-TAED code having a localized parity through the right extension.

According to some example embodiments, various SEC-TAED PCMs may be generated through an SEC-TAED code algorithm, and according to a target message length, the SEC-DED-TAED PCM may be completed using expurgation and extension methods. When the target message length is 32, the parity length to be input is 6, and the SEC-TAED PCM completed through Algorithm 1 is as follows.

FIG. 19 is a view illustrating some example embodiments of $H_{base}$ obtained through an SEC-TAED code design for a parity length of 6. FIG. 20 is a view illustrating another example embodiment of $H_{base}$ obtained through an SEC-TAED code design for a parity length of 6.

When the parity length is 6, a length of $H_{base}$ is $L=3\cdot2^{6-2}-1=47$. When expurgation and extension methods are used for the DED, the expansion expurgation generates submatrix $$\left(H_{k_s}^s\right)$$

in consideration of converting 1 bit of a message into 1 bit of a parity. The submatrix considering each method in $H_{base}$ is as follows.

FIG. 21 is an example view illustrating an SEC-TAED submatrix for a message length of 32 in consideration of expurgation. FIG. 22 is an example view illustrating an SEC-TAED submatrix for a message length of 32 in consideration of a left extension. When the submatrix ($H_{32}$) is configured for each method, the method is executed to complete the SEC-DED-TAED PCM for the message length of 32. FIG. 23 is an example view illustrating a (39, 32) SEC-DED-TAED code through expurgation. FIG. 24 is an example view illustrating a (39, 32) SEC-DED-TAED code through a left extension.

The following presents results of performance comparison when used for self-interference cancellation. This is a comparison between optimized extension and expurgation SEC-DED-TAED codes among PCMs. When an SEC-TAED code length determined by a target message length matches a length that may be generated through an input parity ($n_{max}$=n=k+r), the expurgation must use 1 more bit than the extension. Accordingly, in this case, the expurgation uses a parity length of the completed SEC-DED-TAED code by 1 bit more than the extension.

For the completed SEC-DED-TAED PCM, an additional operation is performed to reduce the total number of 1s in the PCM. A weight of columns of each PCM is calculated, and if the weight is even, a last bit of the column is converted to zero. This performs the same operation for both the extension and the expurgation.

FIG. 25 is an example view illustrating optimization in a PCM of a (39, 32) SEC-DED-TAED code through expurgation. FIG. 26 is an example view illustrating optimization in a PCM of a (39, 32) SEC-DED-TAED code through extension.

By iteratively generating SEC-DED-TAED codes optimized within PCM (Parity Check Matrix), it has identified a PCM with the lowest total count of 1s and the maximum row weight among the PCMs. This specific SEC-DED-TAED encoded PCM is both systematic and features distributed parity, making it distinct from the others. A comparison was conducted with the Sánchez code, which exhibits error correction performance similar to this PCM. As a result, when considering a message length of k=16, it was observed that the difference in the total count of 1s between the PCM and the Sánchez code is 14. Notably, as the message length increases, this difference progressively grows. Additionally, the maximum row weight differs by up to 12 when the message length is 16, and this difference increases with longer message lengths. These findings demonstrate that the SEC-DED-TAED code, achieved with low complexity, outperforms existing SEC-DED-TAED codes in terms of performance.

Table 1 illustrates the total number of 1s in the SEC-DED-TAED PCM per message length.

TABLE 1

| Division | k = 16 | k = 32 | k = 64 | k = 128 |
|---|---|---|---|---|
| Proposed Extension SEC-DED-TAED code | 56 | 111 | 236 | 515 |
| Proposed Expurgation SEC-DED-TAED code | 58 | 115 | 238 | 519 |
| A. Sánchez SEC-DED-TAED code | 70 | 137 | 288 | 604 |

Table 2 illustrates a low weight having a maximum weight of a SEC-DED-TAED PCM per message length.

TABLE 2

| Division | k = 16 | k = 32 | k = 64 | k = 128 |
|---|---|---|---|---|
| Proposed Extension SEC-DED-TAED code | 10 | 18 | 33 | 63 |
| Proposed Expurgation SEC-DED-TAED code | 11 | 19 | 33 | 63 |
| A. Sánchez SEC-DED-TAED code | 22 | 39 | 72 | 137 |

Example embodiments may begin with generating SEC-TAED PCM in order to have a localized parity of a SEC- DED-TAED code. In this case, because only the right extension is considered as the DED support method, $$H_{k_s}^s$$

for the full rank in the SEC-TAED code PCM must be generated considering that the weights of the right two column vectors are odd. In some example embodiments, when generating the SEC-DED-TAED code having the localized parity with a message length of 32, first, $H_{base}$ and SEC-TAED code $$H_{k_s}^s$$

are considered. When the message length is 32, the weights of the two right columns of the PCM are odd-odd during the right extension, so that the code is generated unchangeably without window sliding. While generating the SEC-TAED PCM, vectors not used in $S_{SEC}$ and $S_{TAED}$ are used for reselection. Because the parity length of the SEC-DED-TAED code is 7 for the message length of 32, $$H_{sub}^{SEC-TAED}$$

for the full rank must have a rank of 6 in size (6×6).

As illustrated in FIG. 28, $$H_{sub}^{SEC-TAED}$$

with a rank of 6 is generated through an SEC-TAED algorithm using random vectors not included in $S_{SEC}$ and $S_{TAED}$. The SEC-DED-TAED code is completed by performing the right extension on the SEC-TAED PCM including $$H_{sub}^{SEC-TAED}$$

as a full rank.

FIG. 26 is a view illustrating a PCM of an SEC-TAED code with a distributed parity. FIG. 28 is an example view illustrating submatrix column vector reselection for a full rank of 6. When a completed code is diagonalized, it may be confirmed that the code is systematic and have a localized parity by confirming a I shape in the PCM, as illustrated in FIG. 28. FIG. 29 is an example view illustrating a PCM of a (39, 32) SEC-DED-TAED code having a localized parity. FIG. 30 is an example view illustrating a PCM of a diagonalized (39, 32) SEC-DED-TAED code. FIG. 31 is an example view illustrating a PCM of a (72, 64) SEC-DED-TAED code having a localized parity. FIG. 32 is a view illustrating a PCM of a diagonalized (72, 64) SEC-DED-TAED code. When the message length is 64, FIGS. 31 and 32 also show codes that are systematic and have a localized parity, and FIG. 31 illustrates the use for decoding, and FIG. 32 illustrates a generation matrix is obtained and used for encoding. A column vector indicated in bold in FIG. 31 represents a replaced column vector.

When the weights of the two right columns in the SEC-DED-TAED code PCM are not odd as in the message length of 128, mis-correction may occur after extension. To prevent this phenomenon, when configuring the SEC-TAED PCM, the right column is made odd-odd and then $$H_{sub}^{SEC-TAED}$$

is reselected to achieve the full rank.

FIG. 33 is an example view illustrating a PCM of a (137,128) SEC-DED-TAED code having a localized parity. FIG. 34 is an example view illustrating a PCM of a diagonalized (137,128) SEC-DED-TAED code. FIGS. 33 and 33 are views illustrating a SEC-DED-TAED PCM in which a localized parity is formed when the message length is 128, and a diagonalized PCM. In FIG. 33, a column vector indicated in bold represents a replaced column vector.

When there is no room for vectors that do not correspond to $S_{SEC}$ and $S_{TAED}$, the full rank may not be achieved only by replacing columns in $$H_{sub}^{SEC-TAED}.$$

In this case, the columns are replaced in a block comprised of a vector with the highest LOD so that $$H_{sub}^{SEC-TAED}$$

becomes a full rank.

FIG. 35 is an example view illustrating a PCM of a (22,16) SEC-DED-TAED code having a localized parity. FIG. 36 is an example view illustrating a PCM of a diagonalized (22,16) SEC-DED-TAED code. FIGS. 35 and 36 show PCMs of a SEC-DED-TAED code having a localized parity and a diagonalized code when the message length is 16.

Various example embodiments may be implemented with a general SEC-DED-TAED code generation technique for all message lengths. Some example embodiments may be implemented by an operation of reducing complexity and latency for decoding performance and a decoding method considering the same. Some example embodiments may be implemented using the SEC-DED-TAED code design technique considering a systematic code. For a previously known SEC-DED-TAED code, it may be difficult to design a long code, and encoding complexity is high due to a systematic code having high decoding complexity, high latency time, and a distributed parity. On the other hand, the SEC-DED-TAED code of example embodiments defines an Odd Column relational expression, may design a long SEC-DED-TAED code, reduce decoding complexity and latency time through an Odd Degree Column-based SEC-DED-TAED code design, and design a systematic SEC-DED-TAED code with a localized parity.

FIG. 37 is a view illustrating an SEC-TAED code generation technique according to some example embodiments. According to various example embodiments, in a p×n H-matrix of a device using a SEC-DED-TAED code, columns in (p−1)×n H-matrix corresponding to SEC-TAED are formed in an order of an odd-odd-even degree, and an i-th column ($h_i$) complies with the following relational expression and may be comprised of $h_i = h_{i-1} + h_{i-3} + h_{i-4}$. In some example embodiments, all columns in the p×n H-matrix may be configured in an odd degree. In some example embodiments, the SEC-DED-TAED code is an H-matrix in which the leading one (LO) of each column has a stepped structure. In some example embodiments, when a device using the SEC-DED-TAED code uses Parity p-bit, the device may generate a systematic code using the SEC-DED-TAED code designed so that the p×p sub-matrix of the H-matrix is a full rank, and may perform encoding using the systematic code.

A first step is an SEC-TAED design. In the SEC-TAED design, columns are arranged in an order of an odd-odd-even degree, and when designing an odd column, a relationship with previous columns is suggested. When the parity number is the same, in order to design a long-length SEC-TAED, it may be necessary to overlap Syndrome values when TAE has occurred as much as possible. When applying the column relational expression of example embodiments, the three syndromes caused by TAE may be designed to have the same value. A second step is a SEC-DED-TAED design. A row is added (a row as all one is added) to a matrix designed in the first step so that all columns become odd columns.

FIG. 38 is a view illustrating a process for imparting a DED property according to some example embodiments. As illustrated in FIG. 38, a submatrix $H_k$ is selected from SEC-TAED $H_{base}$ according to a DED method. As a DED property imparting method, a left extension method, an expurgation method, and a right extension method may be used. If the All-0 column is arranged on the right side of the SEC-TAED PCM, the TAE syndrome overlaps with the SE syndrome. A PCM is selected so that the last two column weights of an SEC-TAED PCM are all odd.

FIG. 39 is a view illustrating PCM weight optimization for low-latency, low-complexity decoding according to some example embodiments. As illustrated in FIG. 39, decoding complexity and latency are lowered. Decoding latency of a PCM is affected by a row weight when calculating the syndrome. Complexity and latency are increased by all ones rows added for the DED. Through PCM sparsification, all rows of the PCM are added to a last row. A weight of the last row is lowered. A detection method for double errors is changed to when the syndrome weight is even.

FIG. 40 is a view illustrating a SEC-DED-TAED code design technique considering a systematic code to reduce code complexity according to some example embodiments. As illustrated in FIG. 40, the SEC-DED-TAED code design technique considering the systematic code to reduce code complexity replaces vectors to achieve diagonalization while maintaining SEC-DED-TAED.

FIG. 41 is a view illustrating a TAE syndrome case according to various example embodiments. As illustrated in FIG. 41, the syndrome caused by three TAEs can be designed to have the same value.

The device described above may be implemented with hardware components, software components, and/or a combination of hardware components and software components. For example, the devices and components described in some example embodiments may be implemented using one or more general-purpose computers or special-purpose computers, such as a processor, a controller, an arithmetic logic unit (ALU), a digital signal processor, a microcomputer, field programmable gate array (FPGA), programmable logic unit (PLU), microprocessor, or any other device capable of executing and responding to an instruction. The processing device may execute an operating system (OS) and one or more software applications running on the operating system.

Additionally, the processing device may access, store, manipulate, process, and generate data in response to the execution of software. For convenience of understanding, there are cases in which a single processing device is described as being used, but those skilled in the art will appreciate that a processing device may include a plurality of processing elements or multiple types of processing elements. For example, the processing device may include a plurality of processors or one processor and one controller. Additionally, other processing configurations, such as a parallel processor, are available.

Software may include computer programs, code, instructions, or a combination of one or more of these, and may configure a processing device to operate as desired or command the processing device independently or collectively. The software and/or data may be embodied in any type of machine, component, physical device, virtual equipment, computer storage medium or device so as to be interpreted by the processing device or to provide instructions or data to the processing device. The software may be distributed over computer systems connected via a network and stored or executed in a distributed manner. The software and data may be stored on one or more computer-readable recording media.

FIG. 42 is an example view illustrating a semiconductor package including a stack semiconductor chip according to some example embodiments. Referring to FIG. 42, a semiconductor package 3000 may be a memory module including at least one stack semiconductor chip 3300 and a system-on-chip (SOC) 3400, mounted on a package board 3100, such as a printed circuit board. An interposer 3200 may be optionally further provided on the package substrate 3100. The stack semiconductor chip 3300 may be formed as a chip-on-chip (CoC).

The stack semiconductor chip 3300 may include at least one memory chip 3320 stacked on a buffer chip 3310 such as a logic chip. The memory chip 3320 may be implemented as an error correction circuit using a parity check matrix supporting the SEC-DED-TAED code, as described in FIGS. 1 to 35.

The buffer chip 3310 and at least one memory chip 3320 may be connected to each other through a through silicon via (TSV). The buffer chip 3320 may perform a training operation on the memory chip 3320. For example, the stack semiconductor chip 3300 may be or may include a high bandwidth memory (HBM) of, for example, 500 GB/sec to 1 TB/sec, or more.

Some example embodiments disclose an H-matrix with a SEC-DED-TAED code that enhances a lifespan of a memory device. A general H-matrix adds parity bits so that a weight of a column is configured in an even-odd-odd column, and for DED, an all-one row is present in the H-matrix. On the other hand, the H-matrix according to some example embodiments adds parity bits so that a weight of a column is comprised of an even-odd-odd column, an i-th odd column is designed by performing an XOR on (i−1)th, (i−3)th, and (i−4)th columns, and all columns become odd after adding an all-one row in the H-matrix for DED. Syndrome calculation complexity and latency may be lowered and systematic encoding is enabled.

Meanwhile, the contents of example embodiments described above are only specific examples for executing various embodiments. Example embodiments will include not only concrete and practically usable means, but also technical concepts, which are abstract and conceptual ideas that can be used as technology in the future. Additionally, example embodiments are not necessarily mutually exclusive with one another. For example, some example embodiments may include one or more features described with reference to one or more figures, and may also include one or more other features described with reference to one or more other figures.

What is claimed is:

1. A memory device, comprising:

a memory cell array having a plurality of memory cells connected to word lines and bit lines; and an error correction circuit configured to perform error correction on data read from the memory cell array, wherein the error correction circuit is configured to perform a 1-bit error correction operation, a 2-bit error detection operation, and a 3-bit error detection operation in a single unified parity check operation using a parity check matrix, and wherein the parity check matrix is configured so that all columns of the parity check matrix are arranged in an order of odd-odd-even degree, and a leading one (LO) of each row is arranged in a stepped structure.

2. The memory device of claim 1, wherein the 1-bit error correction operation includes a single error correction (SEC) operation, the 2-bit error detection operation includes a double error detection (DED) operation, and the 3-bit error detection operation includes a triple adjacent error detection (TAED) operation.

3. The memory device of claim 2, wherein the parity check matrix includes a $p \times n$ H-matrix, and columns of a $(p-1) \times n$ H-matrix are arranged in an odd-odd-even degree, wherein p is a number of rows of the $p \times n$ H-matrix, and n is a number of columns of the $p \times n$ H-matrix.

4. The memory device of claim 3, wherein an i-th column $(h_i)$ satisfies an equation $h_i = h_{i-1} + h_{i-3} + h_{i-4}$.

5. The memory device of claim 2, wherein the parity check matrix corresponds to a SEC-DED-TAED code defining an odd column relational expression, wherein the odd column relational expression for each odd column corresponding to an i-th column $(h_i)$ satisfies an equation $h_i = h_{i-1} + h_{i-3} + h_{i-4}$.

6. The memory device of claim 2, wherein the parity check matrix corresponds to a SEC-DED-TAED code based on an odd degree column.

7. The memory device of claim 3, wherein all the columns of the $p \times n$ H-matrix are configured in an odd degree.

8. The memory device of claim 7, wherein the $p \times n$ H-matrix is configured to implement double error detection (DED).

9. The memory device of claim 1, wherein the error correction circuit includes a systematic code and has a distributed parity.

10. The memory device of claim 9, wherein p is a number of parity p-bits generated by the error correction circuit, corresponding to a number of columns of the parity check matrix, and the systematic code includes a $p \times p$ sub-matrix having a full rank when using parity p-bits.

11. A memory system, comprising:

at least one memory device configured to perform a first error correction operation; and a controller configured to control the at least one memory device and to perform a second error correction operation, wherein at least one of the first error correction operation and the second error correction operation includes performing a 1-bit error correction operation, a 2-bit error detection operation, and a 3-bit error detection operation using a parity check matrix in a single unified parity check operation, and wherein the parity check matrix is configured so that all columns of the parity check matrix are arranged in an order of odd-odd-even degree, and leading one (LO) of each row is arranged in a stepped structure, wherein the 1-bit error correction operation includes a single error correction (SEC) operation, the 2-bit error detection operation includes a double error detection (DED) operation, and the 3-bit error detection operation includes a triple adjacent error detection (TAED) operation.

12. The memory system of claim 11, wherein the parity check matrix corresponds to a SEC-DED-TAED code.

13. The memory system of claim 11, wherein the parity check matrix corresponds to a systematic code.

14. The memory system of claim 13, wherein the parity check matrix is configured by replacing at least one or more column vectors to generate a diagonalized sub-matrix while maintaining a SEC-DED-TAED code.

15. The memory system of claim 11, wherein the parity check matrix is configured to include at least three predefined error patterns into one syndrome, wherein the at least three predefined error patterns includes SEC, DED, and TAED.

16. An operating method of a memory device, comprising:

encoding a message in an error correction circuit of the memory device using a parity check matrix, the encoding the message comprising performing an exclusive OR operation in a hardware-enabled XOR circuit;

receiving a codeword generated by encoding the message through a channel; and decoding the received codeword using the parity check matrix, wherein the parity check matrix is configured so that all columns of the parity check matrix are arranged in an order of odd-odd-even degree, and leading one (LO) of each row is arranged in a stepped structure, and wherein the parity check matrix corresponds to a systematic SEC-DED-TAED code including a single error correction (SEC), a double error detection (DED), and a triple adjacent error detection (TAED) performed in a single unified parity check operation.

17. The operating method of the memory device of claim 16, wherein the parity check matrix comprises a plurality of sub-matrices, each sub-matrix of the plurality of sub-matrices each corresponding to a respective SEC-DED-TAED code according to a length of the message.

18. The operating method of the memory device of claim 16, further comprising:

selecting an odd weight column and two preceding columns of the parity check matrix, and generating a syndrome for error detection based on the odd weight column and the two preceding columns selected.

19. The operating method of the memory device of claim 16, wherein the parity check matrix is based on at least one of expurgation, a left extension, or a right extension.

\* \* \* \* \*